US 8,068,370 B2

(12) United States Patent
Lue

(10) Patent No.: US 8,068,370 B2
(45) Date of Patent: Nov. 29, 2011

(54) FLOATING GATE MEMORY DEVICE WITH INTERPOLY CHARGE TRAPPING STRUCTURE

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 255 days.

(21) Appl. No.: 12/409,935

(22) Filed: Mar. 24, 2009

(65) Prior Publication Data

US 2009/0262583 A1 Oct. 22, 2009

Related U.S. Application Data

(60) Provisional application No. 61/124,652, filed on Apr. 18, 2008.

(51) Int. Cl.
G11C 16/06 (2006.01)
H01L 29/788 (2006.01)
H01L 29/792 (2006.01)
H01L 21/336 (2006.01)

(52) U.S. Cl. ........... 365/185.28; 257/315; 257/E29.309; 257/E21.422; 257/E21.423; 365/185.18

(58) Field of Classification Search ............ None
See application file for complete search history.

(56) References Cited

U.S. PATENT DOCUMENTS

| | | |
|---|---|---|
| RE31,083 E | 11/1982 | DeKeersmaecker et al. |
| 4,630,086 A | 12/1986 | Sato et al. |
| 5,286,994 A | 2/1994 | Ozawa et al. |
| 5,319,229 A | 6/1994 | Shimoji et al. |
| 5,851,881 A | 12/1998 | Lin et al. |
| 5,952,692 A | 9/1999 | Nakazato et al. |
| 6,011,725 A | 1/2000 | Eitan et al. |
| 6,026,026 A | 2/2000 | Chan et al. |
| 6,074,917 A | 6/2000 | Chang et al. |
| 6,169,693 B1 | 1/2001 | Chan et al. |

(Continued)

FOREIGN PATENT DOCUMENTS

EP 0016246 10/1980

(Continued)

OTHER PUBLICATIONS

Search Report mailed Aug. 26, 2010 in European Application No. 09158082.9, 7 pages.

(Continued)

*Primary Examiner* — Hoai V Ho
*Assistant Examiner* — James G Norman
(74) *Attorney, Agent, or Firm* — Mark A. Haynes; Haynes Beffel & Wolfeld LLP

(57) ABSTRACT

A charge trapping floating gate is described with asymmetric tunneling barriers. The memory cell includes a source region and a drain region separated by a channel region. A first tunneling barrier structure is disposed above the channel region. A floating gate is disposed above the first tunneling barrier structure covering the channel region. A second tunneling barrier is disposed above the floating gate. A dielectric charge trapping structure disposed above the second tunneling barrier and a blocking dielectric structure is disposed above the charge trapping structure. A top conductive layer disposed above the top dielectric structure acts as a gate. The second tunneling barrier is a more efficient conductor of tunneling current, under bias conditions applied for programming and erasing the memory cell, than the first tunneling barrier structure.

23 Claims, 32 Drawing Sheets

U.S. PATENT DOCUMENTS

| | | | |
|---|---|---|---|
| 6,218,700 | B1 | 4/2001 | Papadas et al. |
| 6,469,343 | B1 | 10/2002 | Miura et al. |
| 6,512,696 | B1 | 1/2003 | Fan et al. |
| 6,521,943 | B1 | 2/2003 | Mine et al. |
| 6,605,840 | B1 | 8/2003 | Wu et al. |
| 6,709,928 | B1 | 3/2004 | Jenne et al. |
| 6,720,630 | B2 | 4/2004 | Mandelman et al. |
| 6,740,928 | B2 | 5/2004 | Yoshii et al. |
| 6,784,480 | B2 | 8/2004 | Bhattacharyya |
| 6,815,764 | B2 | 11/2004 | Bae et al. |
| 6,818,558 | B1 | 11/2004 | Rathor et al. |
| 6,858,906 | B2 | 2/2005 | Lee et al. |
| 6,897,533 | B1 | 5/2005 | Yang et al. |
| 6,912,163 | B2 | 6/2005 | Zheng et al. |
| 6,977,201 | B2 | 12/2005 | Jung et al. |
| 7,033,956 | B1 * | 4/2006 | Wu ............... 438/765 |
| 7,075,828 | B2 | 7/2006 | Lue et al. |
| 7,115,469 | B1 | 10/2006 | Halliyal et al. |
| 7,115,942 | B2 | 10/2006 | Wang |
| 7,133,313 | B2 | 11/2006 | Shih et al. |
| 7,151,692 | B2 | 12/2006 | Wu |
| 7,164,603 | B2 | 1/2007 | Shih et al. |
| 7,187,590 | B2 | 3/2007 | Zous et al. |
| 7,190,614 | B2 | 3/2007 | Wu |
| 7,209,390 | B2 | 4/2007 | Lue et al. |
| 7,442,988 | B2 | 10/2008 | Oh et al. |
| 7,473,589 | B2 | 1/2009 | Lai et al. |
| 7,646,056 | B2 | 1/2010 | Choi et al. |
| 7,961,525 | B2 * | 6/2011 | Osame et al. ............ 365/185.29 |
| 2003/0025147 | A1 | 2/2003 | Nomoto et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0047755 | A1 | 3/2003 | Lee et al. |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0108512 | A1 | 6/2004 | Iwata et al. |
| 2004/0183126 | A1 | 9/2004 | Bae et al. |
| 2004/0251489 | A1 | 12/2004 | Jeon et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0062098 | A1 | 3/2005 | Mahajani et al. |
| 2005/0074937 | A1 | 4/2005 | Jung |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0088983 | A1 | 4/2006 | Fujisawa et al. |
| 2006/0118858 | A1 | 6/2006 | Jeon et al. |
| 2006/0124991 | A1 | 6/2006 | Ohba |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0047303 | A1 | 3/2007 | Kim |
| 2007/0069283 | A1 | 3/2007 | Shih et al. |
| 2007/0120179 | A1 | 5/2007 | Park et al. |
| 2007/0138539 | A1 | 6/2007 | Wu et al. |
| 2007/0268753 | A1 | 11/2007 | Lue et al. |
| 2008/0067577 | A1 | 3/2008 | Wang et al. |
| 2008/0081462 | A1 | 4/2008 | Choi |
| 2008/0099830 | A1 | 5/2008 | Lue et al. |
| 2008/0116506 | A1 | 5/2008 | Lue |
| 2009/0021979 | A1 * | 1/2009 | Sung et al. ............ 365/184 |
| 2009/0039417 | A1 | 2/2009 | Chen et al. |

FOREIGN PATENT DOCUMENTS

| | | |
|---|---|---|
| EP | 1411555 | 4/2004 |
| EP | 01677311 | 7/2006 |
| EP | 01677312 | 7/2006 |
| JP | 59074680 A | 4/1984 |
| JP | 11040682 | 2/1999 |
| JP | 2004363329 | 12/2004 |
| JP | 2005184029 | 7/2005 |
| JP | 2006190990 | 7/2006 |
| KR | 1020060106298 | 10/2006 |
| KR | 10088202 | 4/2008 |

OTHER PUBLICATIONS

Aminzadeh et al., "Conduction and Charge Trapping in Polysilicon-Silicon Nitride-Oxide-Silicon Structures under Positive Gate Bias," IEEE Trans. on Electron Dev. 35(4) Apr. 1998 459-467.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Kim, Moon Kyung, et al., "The Effects of ONO thickness on Memory Characteristics in Nano-scale Charge Trapping Devices," Int'l Symp on VLSI Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Lee, Chang, et al., "A Novel SONOS Structure of SiO2/Si28271203 with TaN Metal Gate for Multi-Giga Bit Flash Memories," IEEE 2003 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557 22.6.1-22.6.4.

Likharev, "Layered Tunnel Barriers for Nonvolatile Memory Devices,"Appl. Phys. Lett. 73(15) Oct. 1998 2137-2139.

Lue et al., "A Novel P-Channel NAND-Type Flash memory 2-bit/cell Operation and High Programming Throughput (>20 MB/sec)," IEEE 2005, 4 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Lue et al., "BE-SONOS: A Bangap Engineered SONOS with Excellent Performance and Retention Time," IEDM Tech. Digest Dec. 2005 547-550.

Minami, et al., "New Scaling Guidelines for MNOS Nonvolatile Memory Devices," IEEE Trans on Electron Devices 38(11) Nov 19912519-2526.

Padilla, Alvaro, et al., "Dual-Bit SONOS FinFET Non-Volatile Memory Cell and New Method of Charge Detection," Int'l Symp on VLSI Technology, Systems and Applications, Apr. 23-25, 2007, pp. 1-2.

Search Report mailed May 9, 2008 in European Application No. 06000064.3 filed on Jan. 3, 2006, 3 pages.

Search Report mailed May 9, 2008 in European Application No. 06000093.2 (Pub. No. EP-01677312) filed on Jan. 3, 2006, 4 pages.

Search Report mailed Feb. 14, 2007 in European Application No. 06000064.3 filed on Jan. 3, 2006, 7 pages.

Search Report mailed Feb. 14, 2007 in European Application No. 06000093.2 (Pub. No. EP-01677312) filed on Jan. 3, 2006, 7 pages.

Search Report mailed Nov. 14, 2007 in European Application No. 06000064.3 (Pub. No. EP-01677312) filed on Jan. 3, 2006, 4 pages.

Search Report mailed Nov. 14, 2007 in European Application No. 06000093.2 (Pub. No. EP-01677312) filed on Jan. 3, 2006, 4 pages.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Tsai et al., "Novel SONOS-Type Nonvolatile Memory Device with Suitable Band Offset in HfAlO Charge-Trapping Layer," Intl'l Symp. on VLSI Tech, Systems and Applications Apr. 23-25, 2007, 2 pages.

Walker et al., "3D TFT-SONOS Memory Cell for Ultra-High Density File Storage Applications," 2003 Symposium on VLSI Tech Digest of Technical Papers, 29-30.

Wen, Huang-Chun, et al., "Issues associated with p-type band-edge effective work function metal electrodes: Fermi-level pinning and flatband roll-off," Int'l Sympon VLSI Technology, Systems and Applications, Apr. 23-25, 2007, pp. 1-2.

White et al., "On the Go with SONOS" IEEE Circuits and Devicces, Jul. 2000, 22-31.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch 2-Bit per Cell Flash Memory," IEDM Tech. Dig. 2002, 931-934.

Extended EP Search Report Mailed Dec. 16, 2010 in family member application 09158082.9, 8 pages.

* cited by examiner

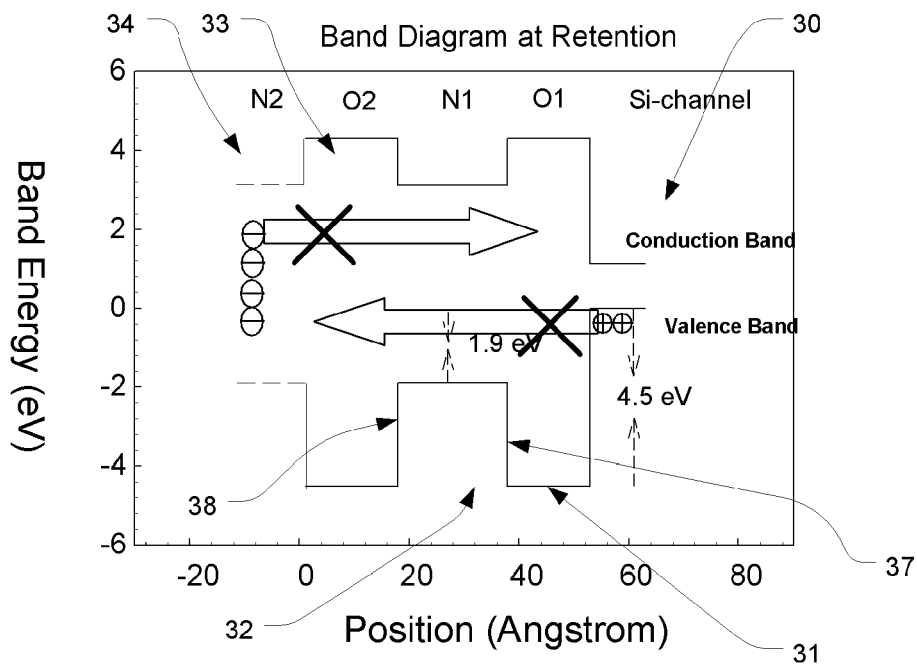
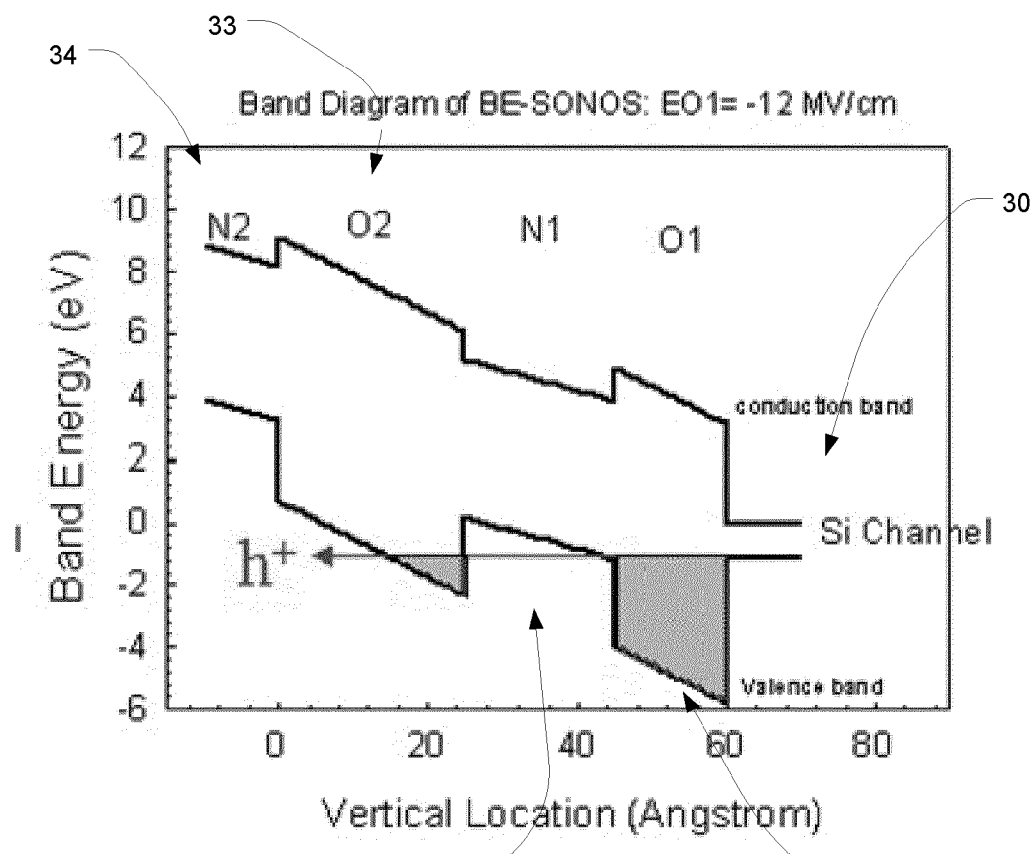

FLOATING GATE MEMORY DEVICE WITH INTERPOLY CHARGE TRAPPING STRUCTURE

RELATED APPLICATIONS

This application claims the benefit of U.S. Provisional Application Ser. No. 61/124,652 filed 18 Apr. 2008.

The present application is related to co-pending U.S. patent application Ser. No. 11/756,559, filed 31 May 2007, entitled CHARGE TRAPPING DEVICES WITH FIELD DISTRIBUTION LAYER OVER TUNNELING BARRIER, which is incorporated by reference as if fully set forth herein.

BACKGROUND OF THE INVENTION

1. Field of the Invention

The invention relates generally to non-volatile memory devices, and in particular to flash memory and manufacturing of flash memory devices.

2. Description of Related Art

Flash memory technology includes memory cells that store charge between the channel and gate of a field effect transistor. The charge stored affects the threshold of the transistor, and the changes in threshold due to the stored charge can be sensed to indicate data.

One type of charge storage memory cell in widespread application is known as a floating gate memory cell. In a floating gate memory cell, a floating gate of conductive material such as polysilicon is formed over a tunneling barrier structure, and an interpoly dielectric is formed over the floating gate to isolate it from the wordline or control gate of the memory cell. The geometry of the floating gate is engineered to establish a high coupling ratio for a voltage between the floating gate and channel, so that a voltage applied on the control gate will result in a stronger electric field across the tunneling barrier structure. For example, floating gates are implemented using a T-shape or a U-shape, which results in a greater surface area between the control gate and the floating gate than between the floating gate and the channel, and thereby a greater capacitance between the floating gate and the control gate. Although this technology has been widely successful, as the sizes of the memory cells and the distances between them shrink, the floating gate technology starts to degrade because of interference between neighboring floating gates.

Another type of memory cell based on storing charge between the channel and gate of a field effect transistor uses a dielectric charge trapping structure. In this type of memory cell, a dielectric charge trapping structure is formed over a tunneling barrier structure which isolates the dielectric charge trapping structure from the channel, and a top dielectric layer is formed over the charge trapping structure to isolate it from the wordline or gate. A representative device is known as a silicon-oxide-nitride-oxide-silicon SONOS cell.

In memory cells using dielectric charge trapping structures, the device can be planar because there is no coupling ratio engineering involved in the design. Because of the planar structure, and very little coupling between adjacent cells, memory cells using dielectric charge trapping structures are forecast to overtake floating gate memory cells in importance as the minimum feature size for the manufacturing processes goes beyond about 45 nanometers.

It is found that even SONOS-type memory cells can suffer performance degradation as the minimum feature size goes below about 45 nanometers. In particular, non-uniform injection of charge along the channel width in the dielectric charge trapping structure due to the fringing fields can result in a region along the edge of the memory cell with effectively a low threshold voltage, while regions toward the center of the channel have an effectively high threshold. The low threshold region along the edge can result in performance degradation.

U.S. patent application Ser. No. 11/756,559, filed 31 May 2007, entitled CHARGE TRAPPING DEVICES WITH FIELD DISTRIBUTION LAYER OVER TUNNELING BARRIER (now US Publication No. 2008-0116506), having the same assignee and same inventor as the present application, describes the combination of a floating gate structure, referred to as a field distribution layer, with a charge trapping layer between the gate and the floating gate structure.

Therefore, it is desirable to maintain a more constant threshold voltage along the channel width dimension even if there is non-uniform charge concentration in the charge trapping structure along the channel width dimension.

SUMMARY OF THE INVENTION

The present invention relates to non-volatile memory devices, and more specifically to non-volatile memory devices including a floating gate between a first tunneling barrier structure and a dielectric charge trapping structure with a second tunneling barrier structure in contact with the floating gate, in which the tunneling barriers are asymmetric. The second tunneling barrier structure can be engineered to have a different electron tunneling probability function than the first tunneling barrier structure by, for example, bandgap engineering and/or using different materials or thicknesses of materials, to encourage electrons in the floating gate to move to the dielectric charge trapping layer, while tending to prevent electron tunneling from the dielectric charge trapping layer through the floating gate to the substrate. The floating gate distributes the electric field that is affected by the charge trapped in the dielectric charge trapping layer more uniformly across the channel, and results in a more constant threshold voltage beneath the conductive layer along the channel width dimension even if there is non-uniform charge concentration in the charge trapping structure along the channel width dimension. The combination of the floating gate and the dielectric charge trapping structure enables the use of memory cell structures, including cells with planar floating gates, which reduce the interference between adjacent devices in a dense array. In addition, the combination of a floating gate and dielectric charge trapping structure, with the first and second tunneling barrier structures arranged so that a majority of the charge trapped by the combination is held in deep traps within the dielectric charge trapping layer, offers improved data retention in a high density flash memory.

Accordingly, an embodiment described herein includes a memory cell including a source region and a drain region separated by a channel region. A first tunneling barrier structure is disposed above the channel region, with a thickness and dielectric characteristics that establish a tunneling probability function. A floating gate is disposed above the first tunneling barrier structure covering the channel region. A second tunneling barrier structure is disposed above the floating gate. A dielectric charge trapping structure is disposed above the second tunneling barrier structure and a blocking dielectric structure is disposed above the charge trapping structure. A top conductive layer disposed above the blocking dielectric structure acts as a gate. The second tunneling barrier structure has thickness and dielectric characteristics according to embodiments of the memory cell described herein, that make it more efficient than the first tunneling barrier structure, as a conductor of tunneling current under bias conditions applied for programming and erasing the memory cell. That is, the second tunneling barrier structure has a higher tunneling probability under a given bias condition, than the first tunneling barrier structure. Also, in bias conditions applied during read operations, the probability can be reversed in some embodiments, so that the second tunneling barrier structure has a lower tunneling probability under a given bias condition, than the first tunneling barrier structure. In this way, the charge trapped in the memory cell is swept into the dielectric charge trapping layer from the floating gate during programming or erasing, where the charge is more immune from charge leakage that would cause poor retention of data in the cell, as both the dimension of the cell and the distance between adjacent cells shrink.

An integrated circuit memory device including cells implemented as described above is also described.

A method for manufacturing a memory cell as described herein comprises forming a first tunneling barrier structure on the surface of a semiconductor substrate, forming a floating gate layer on the tunneling barrier structure, forming a second tunneling barrier structure on the surface of the floating gate layer, forming a charge trapping structure on the second tunneling barrier structure, forming a top dielectric structure on the charge trapping structure, and forming a top conductive layer on the dielectric structure. The second tunneling barrier structure is different from the first, as discussed above. A source region and a drain region can be formed by implanting dopants in the semiconductor substrate, such that the source region and the drain region are separated by a channel, and the channel is below the tunneling barrier structure.

A new memory is described which is essentially the "fusion" of floating gate FG and bandgap engineered BE-SONOS charge-trapping devices. Unlike the conventional Flash memory structure, a charge-trapping device (BE-SONOS) is fabricated on top of a floating gate FG to replace the interpoly dielectric layer IPD. A very planar structure with an ultra-thin poly FG (<5 nanometers) can be provided, enabling the pitch scaling unlike a prior art structure.

Other aspects and advantages of the present invention can be seen on review of the drawings, the detailed description and the claims, which follow.

BRIEF DESCRIPTION OF THE DRAWINGS

FIG. 14A is a band diagram for a bandgap engineered tunneling barrier structure including band offset technology at low electric fields, showing a relatively low tunneling probability.

FIG. 14B is a band diagram for a bandgap engineered tunneling barrier structure including band offset technology at high electric fields, showing a relatively high tunneling probability.

DETAILED DESCRIPTION

A detailed description is provided with reference to FIGS. 1-28.

Figure 1:
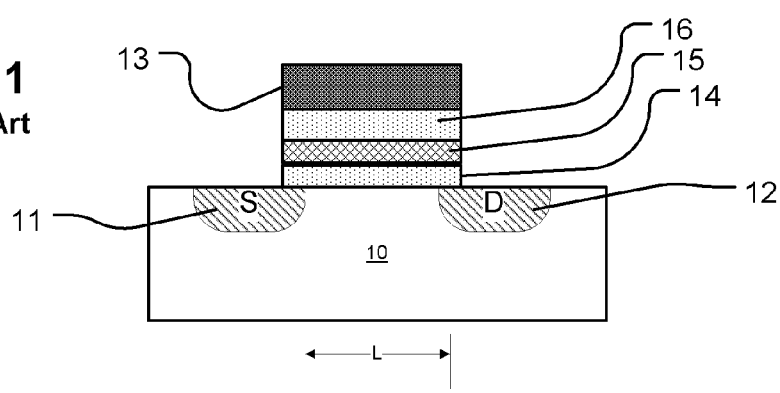
FIG. 1 illustrates the basic structure of a prior art SONOS-type memory cell.

FIG. 1 illustrates the basic structure of a prior art SONOS-type memory cell. The cell is formed on a semiconductor substrate 10 in which a first doped region 11 acts as a source terminal and a second doped region 12 acts as a drain terminal. A control gate 13 is formed over a charge trapping structure which includes a bottom tunneling barrier structure 14, a dielectric charge trapping layer 15, and a top dielectric 16. The channel of the memory cell is the region of the substrate 10 between the first doped region 11 and the second doped region 12. The dimension L shown in FIG. 1 is typically referred to as the channel length L, because current flows between the source and drain along this dimension of the channel. The SONOS-type memory cell shown in FIG. 1 is often configured in a NAND array configuration, in which a column in the array includes sets of memory cells arranged in series between a ground contact and a global bitline contact.

Figure 2:
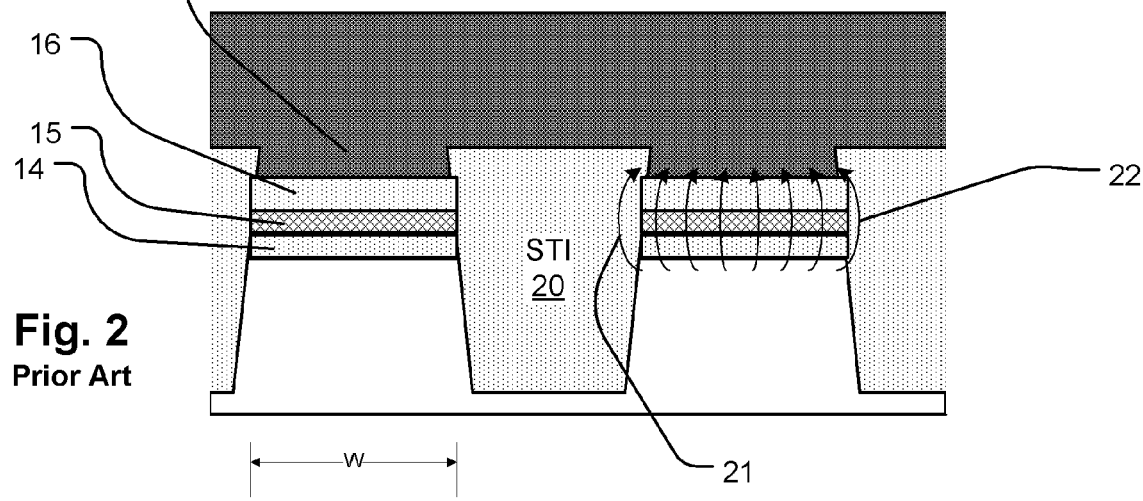
FIG. 2 illustrates a cross-sectional view of basic prior art SONOS-type memory cells taken along the channel width dimension, parallel with the wordline in a NAND array configuration.

FIG. 2 illustrates a cross-sectional view of basic prior art SONOS-type memory cells taken along the channel width dimension, parallel with the wordline 13 in a NAND array configuration. For perspective, the source and drain terminals are positioned above and below the plane of the drawing of FIG. 2. The individual columns of memory cells are separated by isolation structures, such as shallow trench isolation STI structures 20. In this manner, the columns of memory cells can be positioned in a dense array separated by the width of a shallow trench isolation structure 20 which can be on the order of the minimum feature size F of the technology used for manufacturing the device. Likewise, the channel width W can be on the order of the minimum feature size F for a NAND array configuration as shown. In FIG. 2, the electric field lines through the dielectric layers between the channel and wordline, including control gate 13, are illustrated, including field lines 21 and 22 on the edges of the channel. The field lines 21 and 22 represent fringing fields, which reduce the effectiveness of the charge trapping at the edges of the charge trapping layer 15. In the embodiment illustrated in FIG. 2, the EOT of the combination of the bottom tunneling barrier structure 14, the charge trapping layer 15, and the top dielectric 16 (typically on the order of 20 nanometers) is significantly less than the channel width W, and the fringing field effects do not substantially interfere with the operation of the device. The EOT is defined as being equal to the thickness of the dielectric layers scaled by the ratio of the dielectric constant of silicon dioxide to the dielectric constant of the material of the layer.

Figure 3:
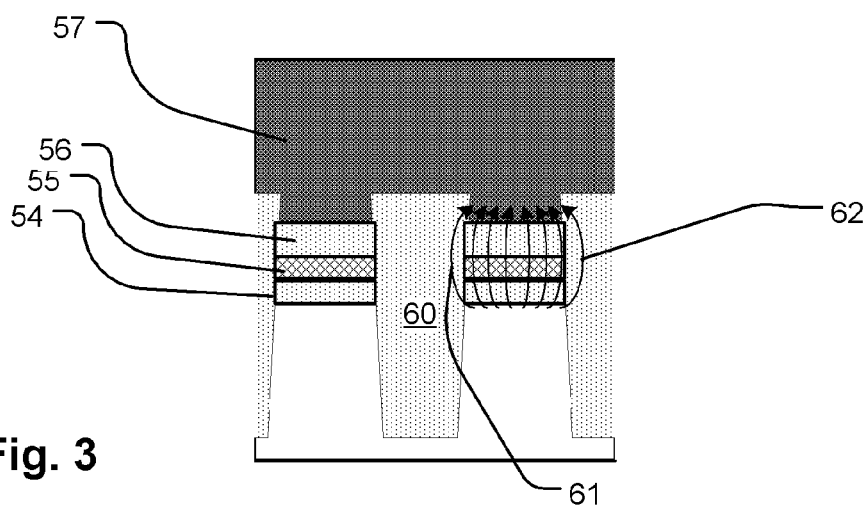
FIG. 3 illustrates a structure similar to FIG. 2 wherein the channel width is reduced to be comparable to the effective oxide thickness of the combination of the bottom dielectric, charge trapping layer, and top dielectric.

It is found that even SONOS-type memory cells can suffer performance degradation as the minimum feature size goes below about 45 nanometers. For example, FIG. 3 illustrates a structure similar to that of FIG. 2, where the channel width W is reduced to be comparable to the EOT of the combination of the bottom dielectric 54, charge trapping layer 55 and a top dielectric 56. In this embodiment the memory cell includes a polysilicon wordline 57, with the columns of cells isolated by STI structures 60. In this embodiment the electric field lines 61 and 62, representing the fringing fields, can have a substantial impact on the effectiveness of the charge trapping layer 55. In particular, non-uniform injection of charge into the charge trapping layer along the channel width due to the fringing fields can result in regions along the edges of the channel with effectively a low threshold voltage, while regions toward the center of the channel have an effectively high threshold.

Figure 4:
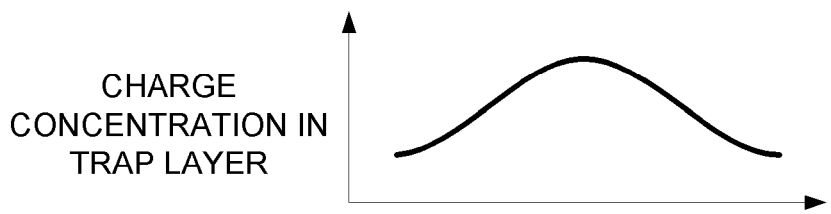
FIG. 4 illustrates uneven charge trapping distribution along the channel width dimension of a prior art memory cell.
Figure 5:
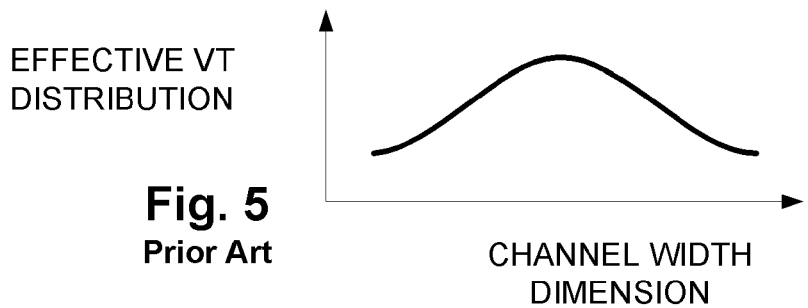
FIG. 5 illustrates uneven charge trapping distribution as shown in FIG. 4 resulting in a distribution of the effective threshold voltage of the memory cell along the channel width dimension.
Figure 6:
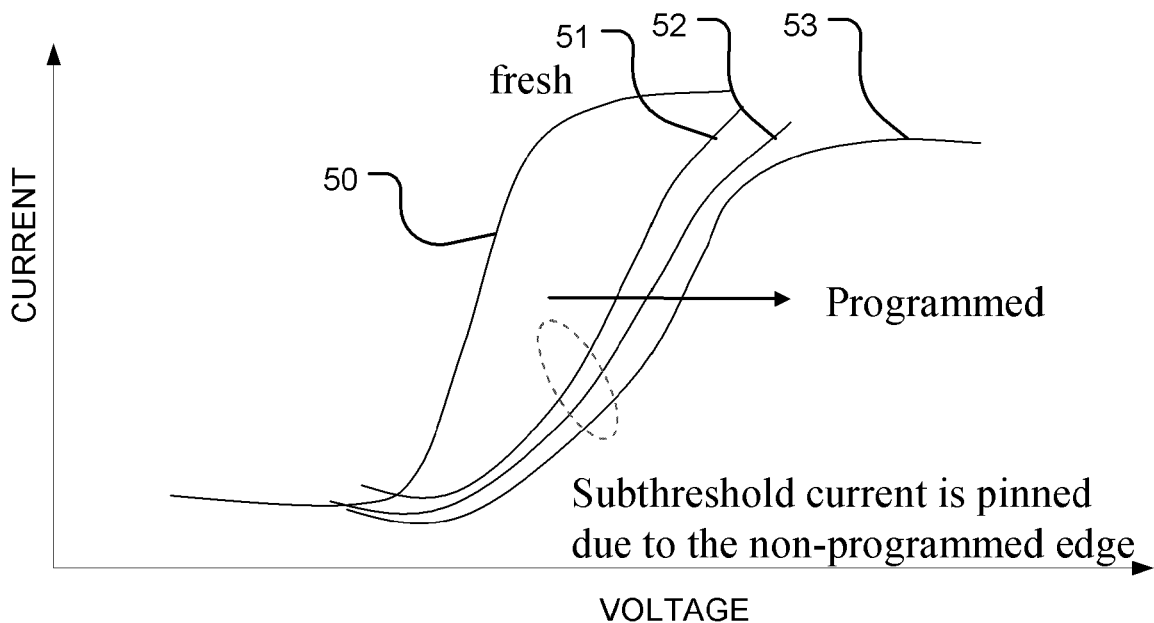
FIG. 6 illustrates drain current through the channel versus gate voltage I-V characteristic of a SONOS-type memory cell suffering from uneven charge trapping distribution.

FIG. 4 illustrates an uneven charge trapping distribution in the charge trapping layer along the channel width dimension of a prior art memory cell. As can be seen in FIG. 4, on the left side of the channel the concentration of charge in the charge trapping layer is low compared to the concentration near the middle of the channel. Also, on the right side of the channel, the concentration of charge in the charge trapping layer is low compared to the concentration near the middle of the channel. FIG. 5 illustrates the uneven charge trapping distribution shown in FIG. 4 resulting in a distribution of the effective threshold voltage of a memory cell along the channel width dimension. Thus a memory cell programmed to a high threshold state may still have low threshold regions along the edges of the cell. FIG. 6 illustrates drain current Id through the channel versus gate voltage Vg I-V characteristic of a SONOS-type cell suffering from uneven charge distribution caused by the fringing effects. The trace 50 on the left shows good I-V characteristics for a cell that has not been programmed and is "fresh". As the programming proceeds and the charge trapped in the charge trapping layer increases, trace 51, trace 52, and trace 53 illustrate that the I-V characteristics degrade, particularly in the subthreshold region. The subthreshold current is pinned, marked by the dashed oval in the figure, because of the inability to trap charge at the edges of the charge trapping structure.

Figure 7:
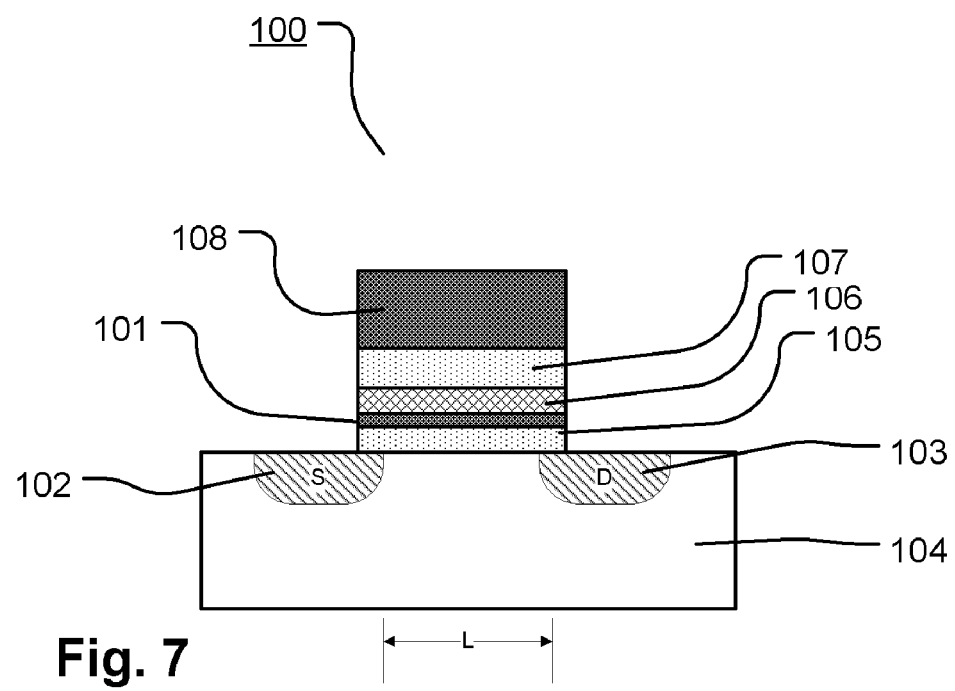
FIG. 7 illustrates a cross-sectional view taken along the channel length dimension of a dielectric charge trapping memory cell including a conductive layer above the tunneling barrier structure.

FIG. 7 illustrates a cross-sectional view taken along the channel length dimension L of a dielectric charge trapping memory cell 100 including a conductive layer 101 above the tunneling barrier structure 105 in accordance with one embodiment. In the embodiment illustrated in FIG. 7, the memory cell 100 includes the substrate 104 with doped region 102 and doped region 103 acting as the source and drain respectively, with doped region 102 and doped region 103 separated by a channel. In the embodiment illustrated in FIG. 7, disposed above the channel, on the surface of the substrate 104, is a tunneling barrier structure 105 which in this example is a single dielectric layer. In the embodiment illustrated in FIG. 7, the memory cell 100 further includes a conductive layer 101 disposed above the tunneling barrier structure 105, a charge trapping structure 106 disposed above the conductive layer 101, a top dielectric structure 107 disposed above the charge trapping structure 106, and a top conductive layer 108 disposed above the top dielectric structure 107. In certain embodiments, the tunneling barrier structure 105 can comprise silicon dioxide or silicon oxynitride. In certain embodiments, the tunneling barrier structure 105 comprises silicon dioxide having a thickness on the order of 4 to 6 nanometers. In certain embodiments the charge trapping structure 106 comprises silicon nitride, nano-particle embedded dielectrics, or other materials including "high-K" metal oxides like $Al_2O_3$, $Hf_2O_3$, etc. In certain embodiments, the charge trapping structure 106 comprises silicon nitride having a thickness on the order of 5 to 7 nanometers. In certain embodiments, the top dielectric structure 107 comprises silicon dioxide, or other dielectric material such as a "high-K" metal oxide like $Al_2O_3$, $Hf_2O_3$, etc. In certain embodiments, the top dielectric structure 107 comprises silicon dioxide having a thickness on the order of 5 to 9 nanometers. Also, in certain embodiments the conductive layer 101 may comprise p-type polysilicon, n-type polysilicon, other doped semiconductor materials, or metals such as aluminum, copper or tungsten. In a representative embodiment, the conductive layer 101 comprises doped polysilicon having a thickness of about 2 to 6 nanometers. The conductive layer 101 can be thin, so that interference caused by electric fields between the conductive layers in neighboring cells is small, and does not interfere with the performance of the memory cells, yet thick enough for reliable formation of a layer that provides for electric field distribution. In certain embodiments the top conductive layer 108 may comprise p-type polysilicon, n-type polysilicon, other doped semiconductor materials, or metals such as aluminum, copper or tungsten. The materials chosen in these example embodiments are representative of materials that are easily manufactured. A wide variety of other materials and combinations can also be used for the memory cell layers and structures.

Figure 8:
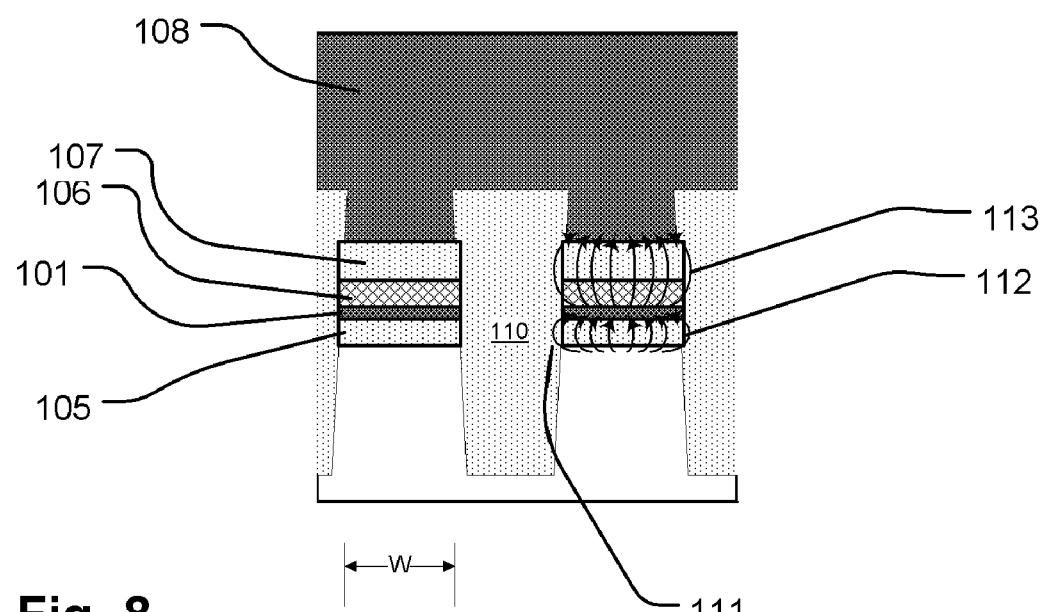
FIG. 8 illustrates a cross-sectional view of an array of memory cells like that shown in FIG. 7 taken along the channel width dimension.

FIG. 8 illustrates a cross-sectional view of an array of memory cells like that shown in FIG. 7 taken along the channel width dimension in accordance with one embodiment. In the embodiment illustrated in FIG. 8, the memory cells are separated by trench isolation structures 110. In the embodiment illustrated in FIG. 8, the channel width W is comparable in size to the effective oxide thickness EOT of the tunneling barrier structure 105, charge trapping structure 106, and top dielectric structure 107 in the memory cell. The conductive layer 101 does not affect the EOT of the memory cell because it is a conductive layer, not a dielectric. One characteristic of the conductive layer 101 is that it is not subject to engineering to induce a large coupling ratio like a floating gate memory cell. Rather, the ratio of the area of the conductive layer 101 disposed above the channel to the area of the channel can be substantially equal to the ratio of the area of the top conductive layer 108 disposed above the channel to the area of the conductive layer 101 disposed above the channel. In this manner, the electric field above the conductive layer 101 is substantially the same as the electric field below the conductive layer 101. Even if some electrons are captured in the conductive layer 101, the large electric field applied during programming will immediately sweep all or most of the electrons into the charge trapping structure 106.

As illustrated in FIG. 8, the fringing fields 111, 112, 113 are terminated by the constant potential of the conductive layer 101. Thus, the fringing field effect in the charge trapping structure 106 is reduced. Furthermore, to the extent that a nonuniform distribution of charge occurs in a memory cell like that illustrated in FIG. 8, the constant potential of the conductive layer 101 will distribute the electric field uniformly across the tunneling barrier structure 105 and cause the effective distribution of threshold voltage in the channel to be more uniform in the channel width dimension.

Figure 9:
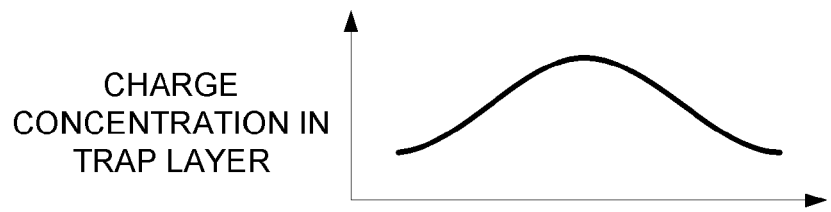
FIG. 9 illustrates an example of charge concentration across the channel width dimension of a dielectric charge trapping memory cell with a conductive layer like that illustrated in FIG. 8.
Figure 10:
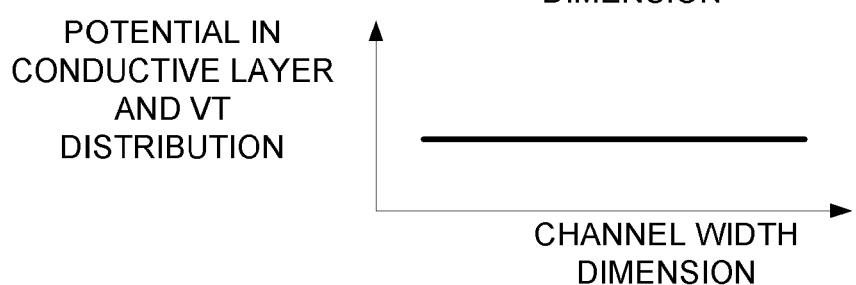
FIG. 10 illustrates constant potential in the conductive layer and the effect the constant potential can have on the distribution of threshold voltage in the channel width dimension.

FIG. 9 illustrates an example of charge concentration across the channel width dimension of a dielectric charge trapping memory cell with a conductive layer like that illustrated in FIG. 8. For this example, the distribution of charge concentration for a memory cell like that illustrated in FIG. 8 is similar to that of a typical SONOS-type memory cell as discussed above. FIG. 10 illustrates the effect the conductive layer 101 can have on the distribution of threshold voltage VT in the channel width dimension. As illustrated in FIG. 10, the constant potential in the conductive layer 101 results in an even distribution of threshold voltage in the channel width dimension. Therefore, even with an uneven distribution of charge in the charge trapping structure 106, the performance of the memory cell does not degrade substantially.

Figure 11:
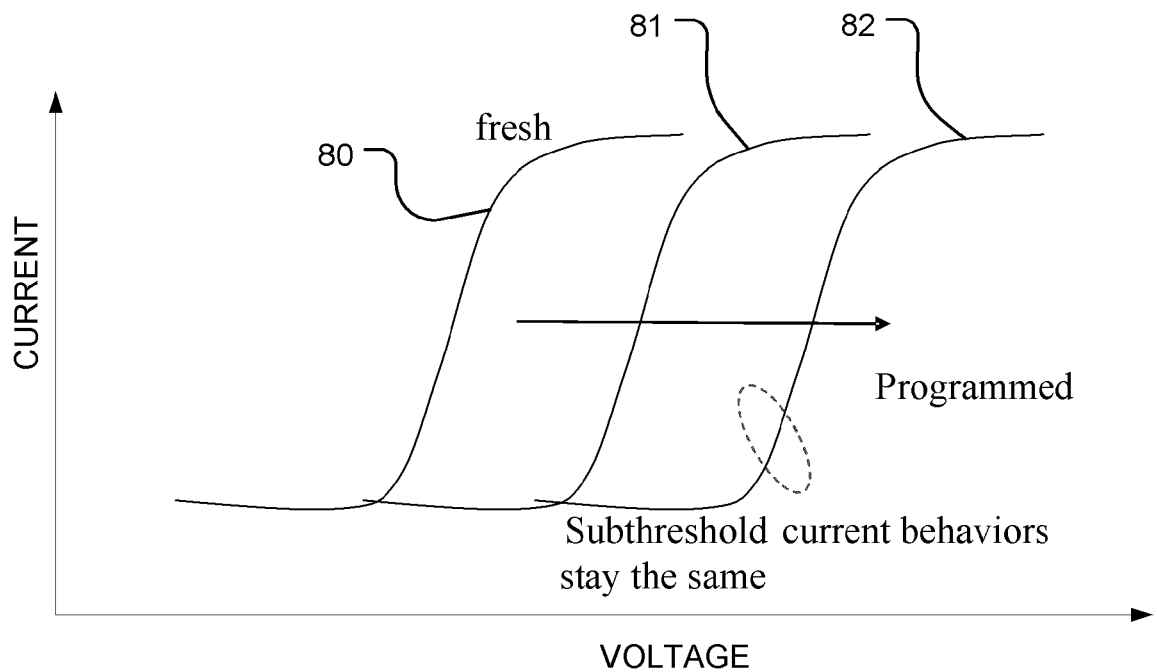
FIG. 11 illustrates a simulation of drain current versus gate voltage I-V characteristics of a dielectric charge trapping memory cell with a conductive layer suffering from uneven charge distribution.

FIG. 11 illustrates a simulation of the drain current Id versus gate voltage Vg I-V characteristic of a dielectric charge trapping memory cell with a conductive layer suffering from the uneven charge distribution in the charge trapping structure in accordance with one embodiment. The trace 80 on the left shows good I-V characteristics for a cell that has not been programmed, and is "fresh". As the programming proceeds and the charge trapped in the charge trapping structure increases, trace 81 and trace 82 illustrate that the I-V characteristics do not degrade. The subthreshold current behavior (subthreshold shift) remains consistent as the threshold voltage increases.

Figure 12:
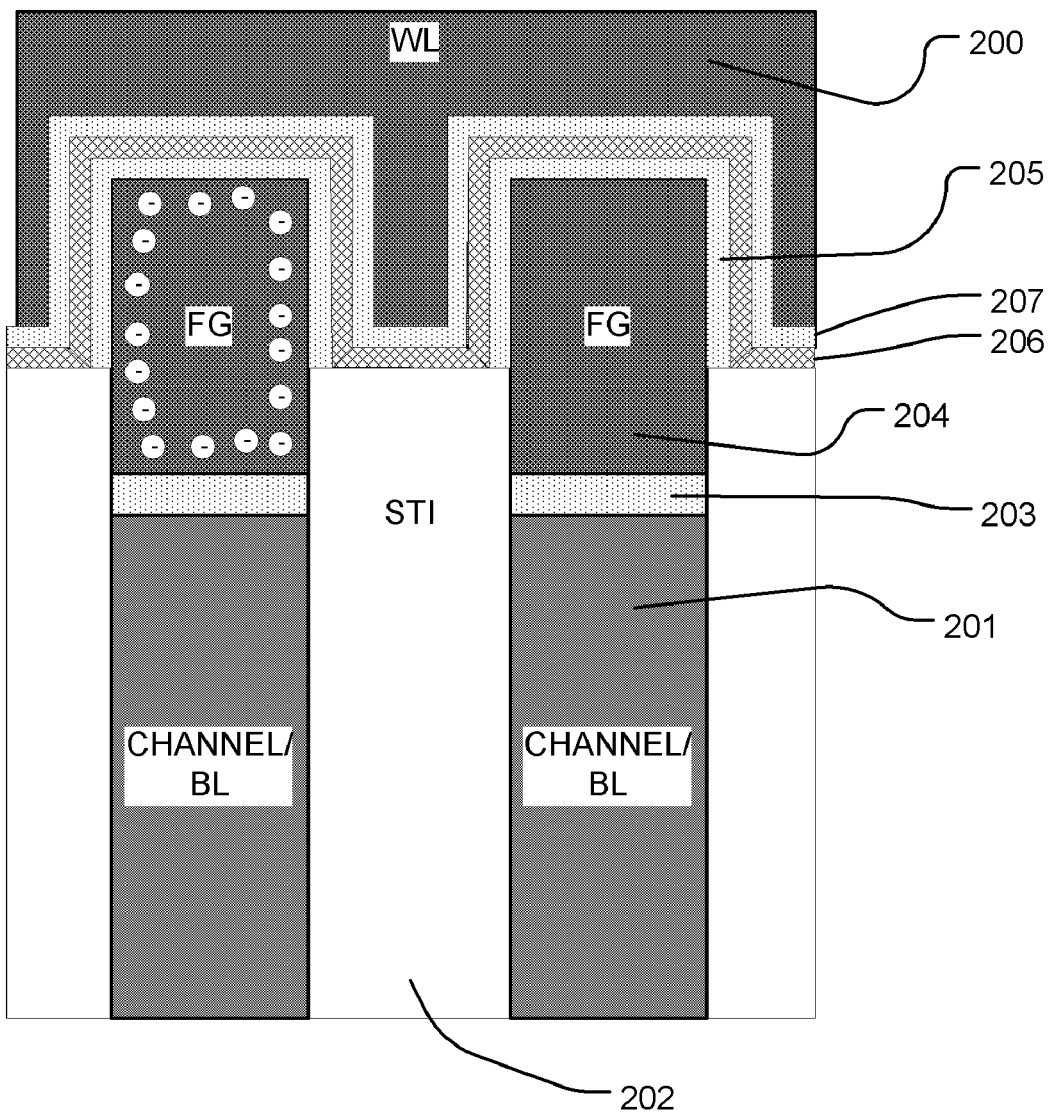
FIG. 12 illustrates a cross-sectional view taken along the wordline dimension of a prior art floating gate memory cell.

FIG. 12 is a cross-section of a conventional floating gate device taken along a wordline 200. The channels of the memory cells are formed on a semiconductor body 201 which extends in a line perpendicular to the page in for example a NAND string. Each of the lines in the semiconductor body is separated from another by a dielectric trench 202, formed using technologies such as shallow trench isolation STI or other approaches. A tunneling barrier structure 203 is formed on the semiconductor body 201. The polysilicon floating gate 204 is formed on tunneling barrier structure 203. An interpoly dielectric, comprising in this example silicon oxide layer 205, silicon nitride layer 206, and silicon oxide layer 207, is formed over the floating gate polysilicon 204. The interpoly dielectric (205-207) is designed to block charge leakage between the wordline 200 and the floating gate 204. Also, the floating gate 204 must be relatively thick (typically greater than 100 nanometers in current technologies) in order to provide a large surface area for coupling between the floating gate 204 and the wordline 200. This large surface area increases the gate coupling ratio of the floating gate device, transferring a larger voltage from the wordline 200 to the floating gate 204 during programming and erasing. However, the thick floating gate element causes severe interference between the floating gates in adjacent lines. In the illustration, electrons are shown distributed around the surface of the floating gate on the left side of the figure. Similar electrons in the floating gate 204 on the right side will create an unwanted electric field between the floating gates, and result in charge leakage through for example de-trapping into surrounding defects or oxide traps in the STI. This problem of interference between adjacent cells has been a significant motivation for the study and implementation of SONOS-type dielectric charge trapping devices, where the charges are trapped in deep traps and are less prone to interference from adjacent cells causing charge leakage.

Moreover, as the manufacturing technologies for memory cells enable 30 nanometers devices, the number of electrons stored in a given cell is becoming very small. It is believed for example that fewer than 100 electrons would be used to establish the memory state in small memory cells. As the number of electrons establishing the memory state becomes smaller and smaller, interference between adjacent cells and other forms of charge leakage are becoming more critical to the design of the memory cell structure.

Figure 13:
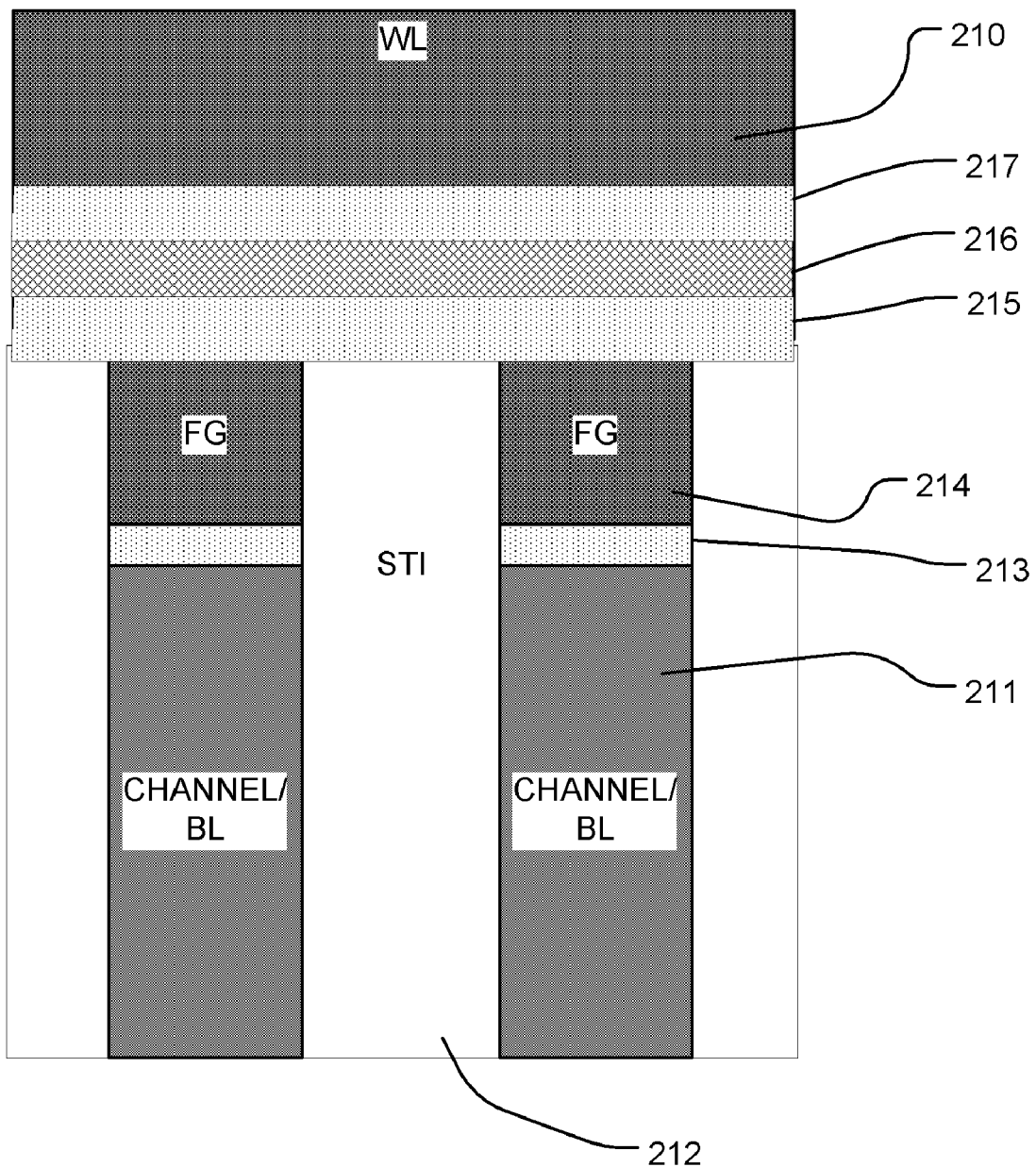
FIG. 13 illustrates a cross-sectional view taken along the wordline dimension of a prior art floating gate memory cell, with a planar cell structure.

FIG. 13 is a cross-section of a prior art floating gate device taken along wordline 210, and illustrates a design trend for improving floating gate devices. In the structure shown in FIG. 13, channels of the memory cells are formed on semiconductor body 211. Each of the lines in the semiconductor body is separated from another by a dielectric trench 212. A tunneling barrier structure 213 is formed on the semiconductor body 211. A floating gate 214 is formed on the tunneling barrier structure 213. A planar, or near-planar, interpoly dielectric, comprising in this example silicon oxide layer 215, silicon nitride layer 216, and silicon oxide layer 217, extends across the top surfaces of floating gate structures along the wordline 210. One problem with planar or near planar devices as shown in FIG. 13 is that they have a very low gate coupling ratio GCR. In order to improve the gate coupling ratio, designers propose to use unconventional interpoly dielectric structures to improve the capacitance of the floating gate to wordline interface. For example, the interpoly dielectric structure (215-217 in the illustrated example) can be replaced with high-K dielectric materials. For example, aluminum oxide or other materials have been proposed. Alternative high-K interpoly dielectric structures may comprise a multilayer stack including silicon oxide as a bottom buffer layer or as both bottom and top buffer layers for a high-K dielectric material like aluminum oxide.

One problem with planar floating gate devices as shown in FIG. 13 is that charge is easily injected into the interpoly dielectric because of the presence of a large electric field during programming. Therefore, the interpoly dielectric easily traps charge. However, is very difficult to remove the charge left in the interpoly dielectric, making the device very hard to erase, and as a result impractical for many applications of flash memory devices.

Figure 14:
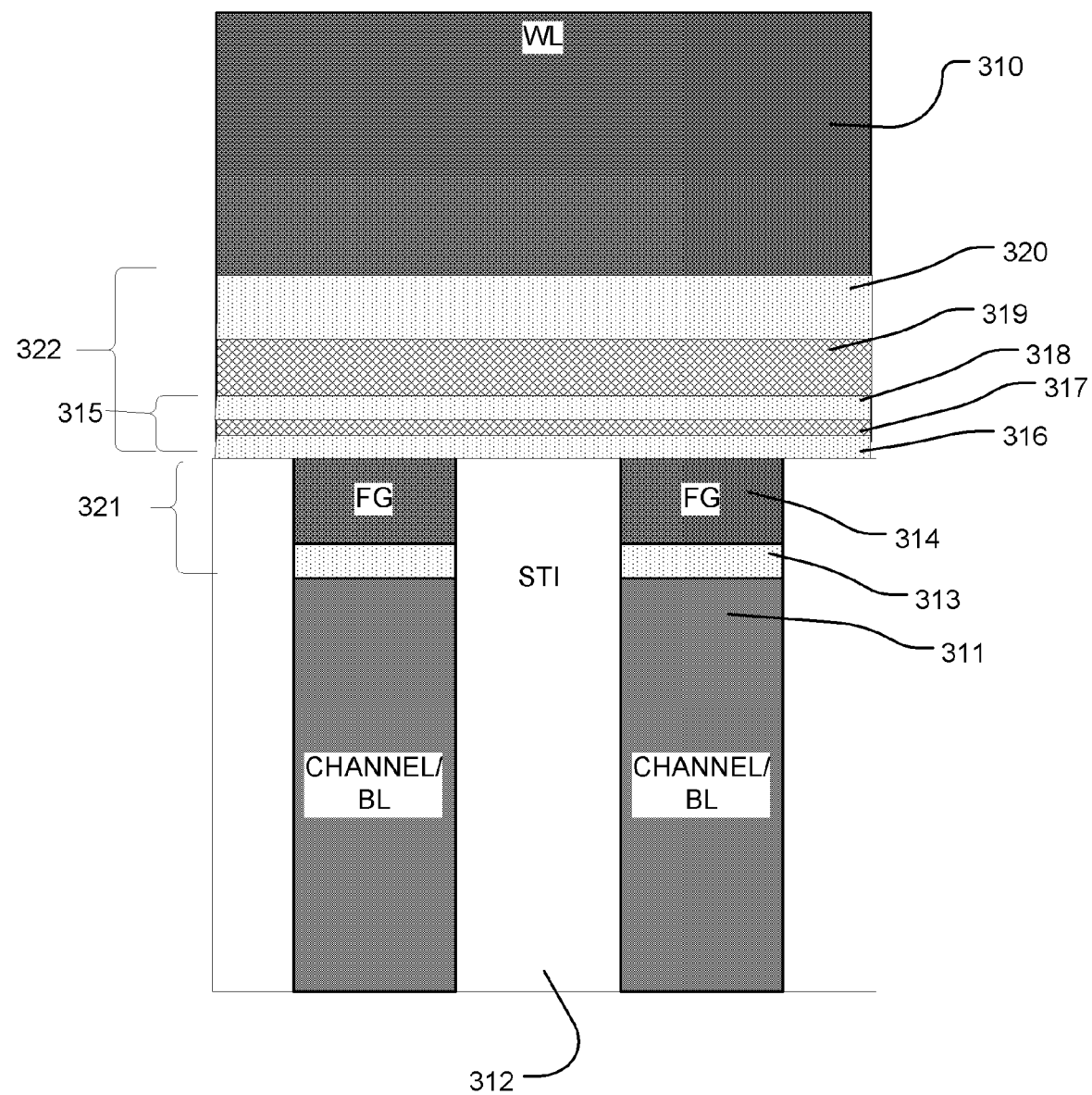
FIG. 14 illustrates a cross-sectional view taken along a wordline in a charge trapping floating gate memory cell as described herein.

FIG. 14 is a cross-section of a charge trapping/floating gate memory device overcoming many of the issues presented by prior art flash memory designs. The cross-section is taken along wordline 310. In the structure shown in FIG. 14, channels of the memory cells are formed on semiconductor body 311. Source and drain terminals are located on opposite sides of the wordlines using for example, implanted dopants or inversion regions. Each of the lines in the semiconductor body is separated from another by a dielectric trench 312. A first tunneling barrier structure 313 is formed on the semiconductor body 311. A floating gate 314 is formed over the first tunneling barrier structure 313, with a dielectric fill providing a planar or near planar structure exposing the top surfaces of the floating gates 314. On top of the floating gate 314, a charge trapping structure is formed. The charge trapping structure includes a second tunneling barrier structure 315, a charge trapping layer 319 and a blocking dielectric layer 320. The second tunneling barrier structure 315 in the illustrated example comprises a multilayer stack of bandgap barrier engineered materials, including a layer of silicon dioxide 316 preferably less than about 2 nanometers thick, a layer of silicon nitride 317 preferably less than about 3 nanometers thick, and a layer of silicon oxide preferably less than about 3.5 nanometers thick. A wordline 310 is formed over the blocking dielectric layer 320. In this way, a floating gate device (basically the region 321) is capped with a charge trapping device (basically the region 322).

The structure is characterized by having first tunneling barrier structure 313 which provides a greater tunneling barrier than does the second tunneling barrier structure 315 under the bias conditions applied for program or erase. Thus, the first tunneling barrier structure 313 and second tunneling barrier structure 315 together provide a means for enabling electrons in the floating gate 314 to move from the body through the floating gate to the charge trapping layer 319 under positive gate bias conditions applied for increasing a threshold voltage, while preventing electron tunneling from the charge trapping layer 319 through the floating gate 314 to the semiconductor body 311 under bias conditions applied for reading. In this manner, during programming electrons are tunneled through the first tunneling barrier structure 313 into the floating gate, and swept through the second tunneling barrier structure 315 because of the lower barrier height during programming into the dielectric charge trapping layer 319, where they are trapped in relatively deep traps in the dielectric material. By managing the relative barrier effectiveness of the first and second tunneling barrier structures 313, 315, the cell can be designed so that very few electrons are actually stored in the floating gate 314.

As can be seen, the interpoly dielectric of a floating gate memory device is replaced with a dielectric charge trapping structure using bandgap engineering BE to provide tunneling barriers that have greater efficiency than the tunneling barrier structure between the substrate and the floating gate. Representative barrier engineering approaches include so-called crested barrier layers and layers having "U-shaped" barriers like the ONO structure as discussed above. The charge trapping layer preferably has a very high trapping efficiency with good data retention provided by deep traps. A silicon nitride layer about 5 nanometers thick or greater is a representative embodiment providing these characteristics. In other embodiments, nano-particle embedded dielectrics, or other materials including "high-K" metal oxides like $Al_2O_3$, $Hf_2O_3$, etc. can be substituted for the silicon nitride.

The blocking dielectric layer 320 should have low leakage, such as provided by silicon oxides and silicon oxynitrides. At the interface with the wordline (control gate), the top dielectric should have a high barrier height to suppress gate injection. Also, using a high-K layer (such as aluminum oxide on top of a silicon oxide buffer layer) in the top portion of the blocking dielectric layer 320, over a buffer oxide layer, (such as aluminum oxide on top of a silicon oxide buffer layer) would reduce the electric field in the blocking layer 320 such that gate injection is further suppressed. The floating gate layer can be relatively thin, such as less than 20 nanometers. Typical embodiments use n+ doped polysilicon. Undoped polysilicon and p+ doped polysilicon can be used as well. It is desirable that the bottom tunnel oxide layer that acts as the tunneling barrier structure between the substrate and the floating gate have very low leakage. Therefore, silicon dioxide is a preferred bottom tunneling barrier structure material having a thickness between 5 and 7 nanometers.

The wordline 310, acting as the gate of the memory cell in a representative embodiment comprises p+polysilicon (work function about 5.1 eV). N+ polysilicon may also be used. Other embodiments employ metals, metal compounds or combinations of metals and metal compounds for the gate, such as platinum, tantalum nitride, metal silicides, aluminum or other metal or metal compound gate materials (e.g. from Ti, TiN, Ta, Ru, Ir, $RuO_2$, $IrO_2$, W, WN, and others. For some applications, it is preferable to use materials having work functions higher than 4 eV, preferably higher than 4.5 eV. A variety of high work function materials suitable for use as a gate terminal are described in U.S. Pat. No. 6,912,163. Such materials are typically deposited using sputtering and physical vapor deposition technologies, and can be patterned using reactive ion etching.

In the embodiment of FIG. 14, the first tunneling barrier structure 313 comprises silicon oxide formed for example using in-situ steam generation ISSG with optional nitridation by either a post deposition NO anneal or by addition of NO to the ambient during deposition. The thickness of the first tunneling barrier structure 313 of silicon dioxide is less than 70 Å and more than about 40 Å, and about 50 Å in a representative embodiment. The floating gate 314 is formed using conventional floating gate polysilicon processes, with reduced thickness in some embodiments as described herein.

In the embodiment illustrated in FIG. 14, the second tunneling barrier structure 315 over the floating gate 314 comprises a composite of materials, including a first layer 316, referred to as a hole tunneling layer, of silicon dioxide on the top surface of the floating gate 314 formed for example using in-situ steam generation ISSG with optional nitridation by either a post deposition NO anneal or by addition of NO to the ambient during deposition. The thickness of the first layer 316 of silicon dioxide is less than about 20 Å, and preferably 15 Å or less. Representative embodiments are 10 Å or 12 Å thick.

Layer 317, referred to as a band offset layer, of silicon nitride lies on the first layer 316 of silicon oxide formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The thickness of the layer 317 of silicon nitride is less than 30 Å, and preferably 25 Å or less.

Layer 318 of silicon dioxide, referred to as an isolation layer, lies on the layer 317 of silicon nitride formed for example using LPCVD high temperature oxide HTO deposition. The thickness of the second layer 318 of silicon dioxide is less than 35 Å, and preferably 25 Å or less. The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the engineered tunneling barrier structure after the first location. This structure, having an inverted "U-shaped" valence band, enables electric field assisted hole tunneling at high speeds while effectively preventing charge leakage through the engineered tunneling barrier structure in the absence of electric fields or in the presence of smaller electric fields induced for the purpose of other operations, such as reading data from the cell or programming adjacent cells.

Thus, in a representative device, the engineered tunneling barrier structure 315 consists of an ultrathin silicon oxide layer O1 (e.g. <=18 Å), an ultrathin silicon nitride layer N1 (e.g. <=30 Å) and an ultrathin silicon oxide layer $O_2$ (e.g. <= 35 Å), which results in an increase in the valence band energy level of about 2.6 eV at an offset 15 Å or less from the interface with the semiconductor body. The $O_2$ layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling or electric field assisted electron tunneling, while improving the ability of the engineered tunneling barrier structure to block leakage during low fields.

More detail about the structure of the engineered tunneling barrier layer is described in more detail below with reference to FIGS. 14A and 14B.

A charge trapping layer 319 in this embodiment comprises silicon nitride having a thickness about 50 Å or more, including for example as much as 70 Å in some implementations, formed for example using LPCVD. Other charge trapping materials and structures may be employed, including for example silicon oxynitride ($Si_xO_yN_z$), silicon-rich nitride, silicon-rich oxide, trapping layers including embedded nanoparticles and so on. A variety of charge trapping materials are described in the above referenced U.S. Patent Application Publication No. 2006/0261401 A1, entitled "Novel Low Power Non-Volatile Memory and Gate Stack", by Bhattacharyya, published 23 Nov. 2006.

The blocking dielectric layer 320 in this embodiment is silicon dioxide and can be formed for example by wet conversion from the nitride by a wet furnace oxidation process. Other embodiments may be implemented using high temperature oxide (HTO) or LPCVD $SiO_2$. The thickness of the blocking dielectric layer can be about 50 Å or more, including for example as much as 90 Å in some implementations.

FIG. 14A is a diagram of the energy levels of the conduction and valence bands of the dielectric tunneling structure including the stack of layers 316-318 of FIG. 14 under a low electric field, showing a "U-shaped" conduction band and an "inverted U-shaped" valence band, showing a probability function for tunneling under the low bias conditions as may be encountered during read operations. From the right side, the bandgap for the semiconductor body is shown in region 30, the valence and conduction bands for the hole tunneling layer are shown in region 31, the bandgap for the offset layer is shown in region 32, the valence and conduction bands for the isolation layer are shown in region 33 and the valence and conduction bands for the charge trapping layer are shown in region 34. Electrons, represented by the circles with the negative sign, trapped within the charge trapping region 34 are unable to tunnel to the conduction band in the channel, because the conduction band of the tunneling barrier structure in all three regions 31, 32, 33 remains high relative to the energy level of the trap. The probability of electron tunneling correlates with the area under the "U-shaped" conduction band in the tunneling barrier structure and above a horizontal line at the energy level of the trap to the channel. Thus, electron tunneling is very unlikely at low field conditions and the barrier structure illustrated is one embodiment that, in combination with a tunneling barrier structure between the floating gate and the body, can effectively prevent electron tunneling from the dielectric charge trapping layer through the floating gate to the semiconductor body under bias conditions applied for reading. Likewise, holes in the valence band of the channel in region 30 are blocked by the full thickness of regions 31, 32 and 33 from tunneling to the charge trapping layer (region 34), and the high hole tunneling barrier height at the channel interface. The probability of hole tunneling correlates with the area over the "inverted U-shaped" valence band in the tunneling barrier structure and below a horizontal line at the energy level of the channel to the charge trapping layer. Thus, hole tunneling is very unlikely at low field conditions.

For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three regions 31, 32, 33 of the tunneling barrier structure remains significantly below the valence band in the channel region 30. The tunneling barrier structure described herein therefore is characterized by band offset characteristics, include a relatively large hole tunneling barrier height in a thin layer (region 31) at the interface with the semiconductor body, and an increase 37 in valence band energy level at a first location spaced less than 2 nanometers from the channel surface. The band offset characteristics also include a decrease 38 in valence band energy level at a second location spaced from the channel by providing a thin layer (region 33) of relatively high tunneling barrier height material, resulting in the inverted U-shaped valence band shape. Likewise, the conduction band has a U-shape caused by the same selection of materials.

FIG. 14B shows the band diagram for the dielectric tunneling structure under conditions of an electric field of about −12 MV/cm in the tunneling region 31, for the purposes of inducing hole tunneling (in FIG. 14B, the O1 layer is about 15 Å thick). Under the electric field the valence band slopes upward from the channel surface. Therefore, at an offset distance from the channel surface the valence band in the tunneling barrier structure increases in band energy level substantially, and in the illustration rises above the band energy in the valence band in the channel region. Therefore, the hole tunneling probability is increased substantially as the area (shaded in FIG. 14B) between the level of the valence band in the channel and above the sloped, inverted U-shaped valence band in the tunneling stack is reduced. The band offset effectively eliminates the blocking function of the offset layer in region 32 and isolation layer in region 33 from the tunneling barrier structure during high electric field allowing a large hole tunneling current under relatively small electric fields (e.g. E<14 MV/cm).

The isolation layer (region 33) isolates the offset layer (region 32) from a charge trapping layer (region 34). This increases the effective blocking capability during low electric field for both electrons and holes, improving charge retention.

The offset layer (region 32) in this embodiment is thin enough that it has negligible charge trapping efficiency. Also, the offset layer is a dielectric, and not conductive. Thus, for an embodiment employing silicon nitride, the offset layer should be less than 30 Å thick, and more preferably about 25 Å or less.

The hole tunneling region 31, for an embodiment employing silicon dioxide, should be less than 20 Å thick, and more preferably less than 15 Å thick. For example, in a preferred embodiment, the hole tunneling region 31 is silicon dioxide about 13 Å or 10 Å thick, and exposed to a nitridation process as mentioned above resulting in an ultrathin silicon oxynitride.

The tunneling barrier structure 315 over the floating gate 314 can be implemented in embodiments of the present invention using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling barrier structure 315 focuses on "hole tunneling" rather than electron tunneling because the technology has solved the problems associated with the need to rely on hole tunneling in SONOS type memory. For example, a tunneling barrier structure consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using barrier engineering. The barrier structure illustrated is one embodiment that, in combination with a tunneling barrier structure between the floating gate and the body, can effectively enable electron tunneling from the body through the floating gate to the dielectric charge trapping layer under positive gate bias conditions applied for programming.

Figure 15:
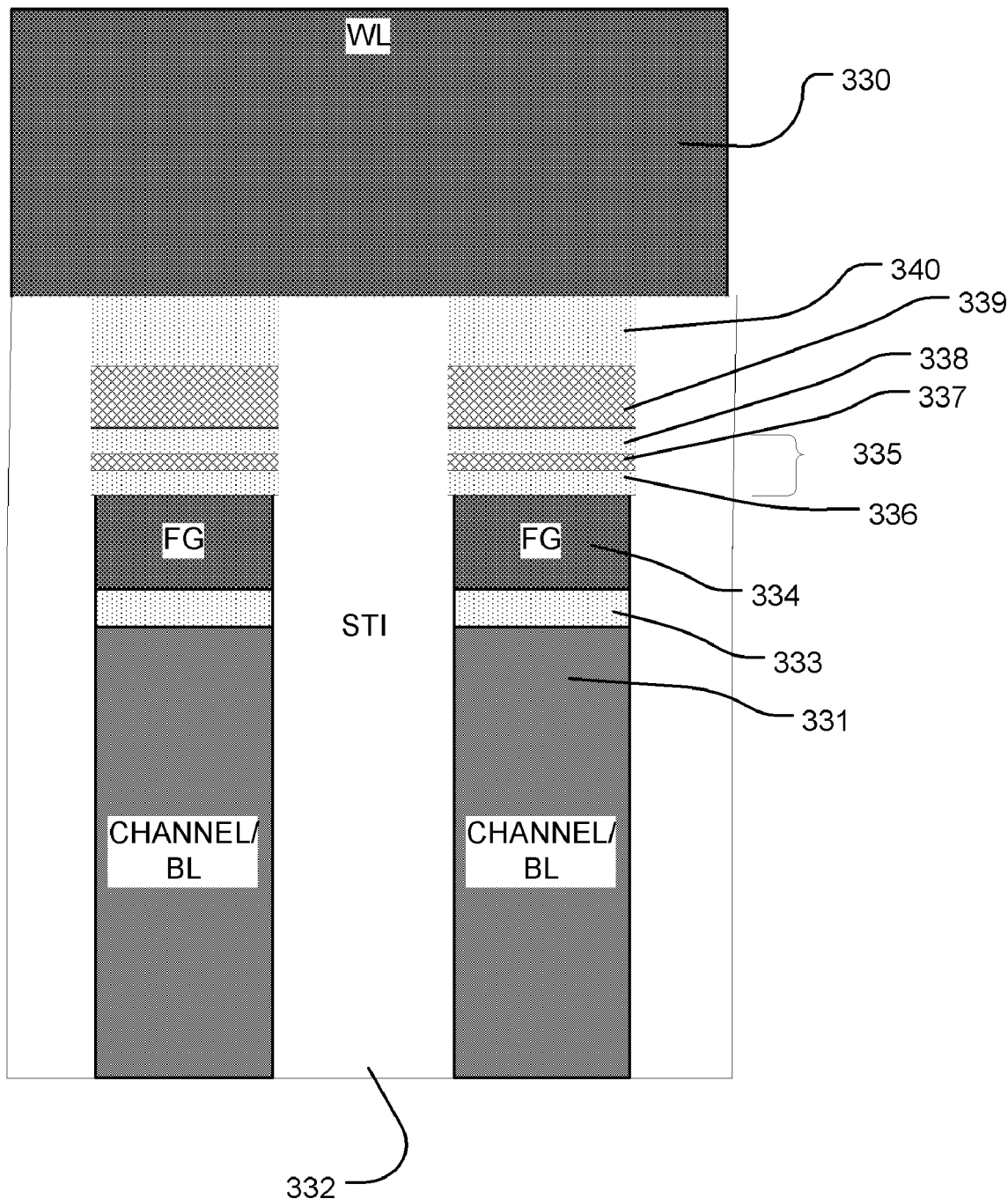
FIG. 15 illustrates a cross-sectional view taken on a wordline in a charge trapping floating gate memory cell as described herein with a charge trapping layer isolated from the floating gate by a second tunneling barrier structure.

FIG. 15 is a cross-section of a charge trapping/floating gate structure, like that of FIG. 14, wherein the charge trapping structure is also patterned to isolate the dielectric charge trapping structure for adjacent cells in the wordline direction to substantially eliminate the possibility of charge migration in very high density arrays between adjacent cells. The cross-section is taken along wordline 330. In the structure shown in FIG. 15, channels of the memory cells are formed on semiconductor body 331. Each of the lines in the semiconductor body is separated from another by a dielectric trench 332. A first tunneling barrier 333 is formed on the semiconductor body 331. A floating gate 334 is formed over the first tunneling barrier 333, with a dielectric fill providing a planar or near planar structure exposing the top surfaces of the floating gates 334. On top of the floating gate 334, a charge trapping structure is formed. The charge trapping structure includes a second tunneling barrier 335, a charge trapping layer 339 and a blocking dielectric layer 340. The second tunneling barrier 335 in the illustrated example comprises a multilayer stack of barrier engineered materials, including a layer of silicon dioxide 336 preferably less than about 2 nanometers thick, a layer of silicon nitride 337 preferably less than about 3 nanometers thick, and a layer 338 of silicon oxide preferably less than about 3.5 nanometers thick. A wordline 330 is formed over the blocking dielectric layer 340. The dielectric stack forming the charge trapping structure is patterned both along the wordline direction and orthogonal to the wordline direction to provide isolated charge trapping islands over respective floating gates 334 in this example. The isolation of the charge trapping structures in both the wordline and bitline directions in the embodiment of FIG. 15 can help reduce any possible lateral migration of charge in the dielectric charge trapping layer during high-temperature storage.

In both the embodiments of FIG. 14 and FIG. 15, the charge trapping/floating gate structure provides better reliability and better erase performance, while having a structure that is planar in a manner similar to a planar floating gate device. The interpoly dielectric of a standard floating gate device is designed to be a non-trapping interpoly dielectric. Charge trapped in the standard floating gate device is undesirable and creates the hard-to-erase condition described above. The interpoly dielectric of the standard floating device is replaced in the structures of FIGS. 14 and 15 with a charge trapping device arranged so that it operates to store the majority of the charge of the memory cell establishing its memory state.

The preferred charge trapping structure is based on the bandgap engineered SONOS device BE-SONOS described in U.S. Patent Application Publication No. US 2007/0268753, which presents a very efficient tunneling barrier structure, that provides a lesser barrier to tunneling during programming and erase bias conditions than does the relatively thick, silicon dioxide first tunneling barrier structure 313, 333. Because most of the injected charge, in the form of holes or electrons, is swept from the floating gate into the deep traps in a dielectric charge trapping layer 319, 339, the floating gate is left in an almost uncharged, neutral condition, even in a high threshold state.

In a representative embodiment, the first tunneling barrier structure (313 in FIG. 14) comprises a silicon dioxide layer between 5 and 7 nanometers thick. This is relatively thick compared to the effective thickness contributing to the barrier height during program and erase bias conditions of the bandgap engineered tunneling barrier layer (or other embodiments) of the second tunneling barrier structure (315 in FIG. 14). However, in a typical floating gate device, the tunneling dielectric is typically greater than 7 nanometers thick because of increased probability of leakage due to charge storage in the floating gates.

In one example, for a BE-SONOS-type charge trapping structure over the floating gate, the silicon dioxide layer 316 can be about 13 Angstroms thick, the silicon nitride layer 317 can be about 20 Angstroms thick, the silicon oxide layer 318 can be about 25 Angstroms thick, the charge trapping dielectric layer 319 can be silicon nitride about 50 Angstroms thick, and the blocking dielectric layer 320 can be silicon dioxide about 50 Angstroms thick. However, the thickness of the charge trapping dielectric layer 319 can be as much as 70 Angstroms or more thick. Also, thickness of the blocking dielectric layer 320 in a silicon dioxide embodiment can be as much as 70 Angstroms or more thick. The overall thickness of the stack is one parameter which is determinative of the operation voltages. Therefore, larger overall thicknesses may require larger operation voltages.

The wordline 310 is typically a polysilicon structure. In preferred embodiments, a higher work function material is preferred, such as P+-doped polysilicon to suppress gate injection during erase operations. Higher work function materials can be used in an interface between the polysilicon wordline and the charge trapping structure, or in place of the polysilicon wordline. Such materials include TaN, WN, Pt, and a number of other possibilities.

Results of simulation of the program and erase performance of a memory cell as described with reference to FIG. 14 are shown in FIGS. 16-19A and 19B. In the simulated cell, the second tunneling barrier layer included a 13 Angstroms thick silicon dioxide layer 316, a 20 Angstroms thick silicon nitride layer 317, and a 25 Angstroms thick silicon oxide layer 318. The charge trapping dielectric layer 319 was silicon nitride 50 Angstroms thick, and the blocking dielectric layer 320 was silicon dioxide 50 Angstroms thick. The first tunneling barrier structure was silicon dioxide 50 Angstroms thick. The floating gate is polysilicon in a layer which can be as thin as 20 Angstroms, or possibly less, thick. Thicker polysilicon in the range of 100 to 1000 Angstroms provide benefits described herein. However, for the purposes of manufacturing very dense arrays, it is preferred that the polysilicon layer be less than 100 Angstroms (10 nanometers) thick.

Figure 16:
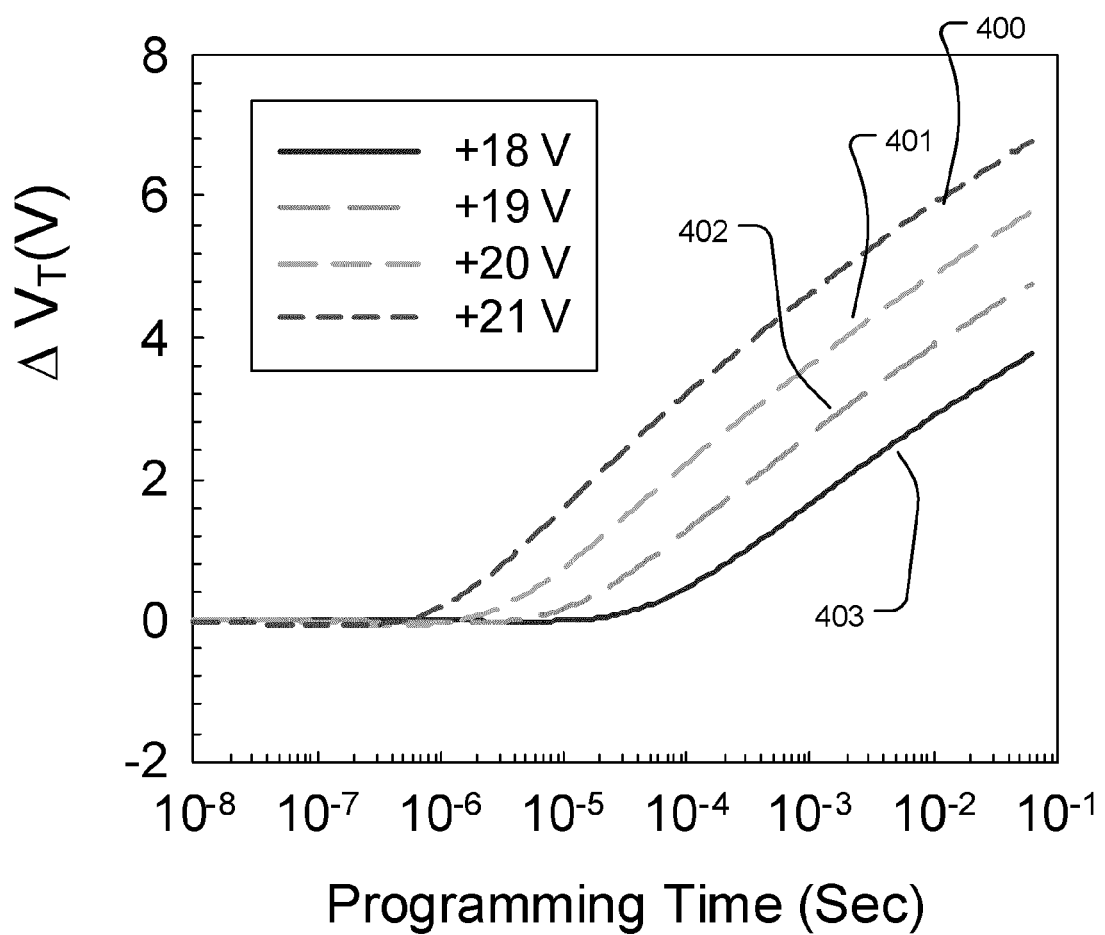
FIG. 16 is a graph showing the results of simulation of programming operations for a charge trapping floating gate memory cell as described herein.

FIG. 16 is a graph showing the change in threshold voltage with time under a programming bias from the gate to the substrate of the cell to induce Fowler-Nordheim tunneling, where the bias voltage is +21 V on trace 400, the bias voltage is +20 V on trace 401, the bias voltage is +19 V on trace 402, and the bias voltage is +18 V on trace 403. Therefore, the memory cell can be programmed with reasonable programming bias voltages in reasonable times. The programming behavior is linear with programming potential, with an incremental step pulse programming ISPP slope near 1.

Figure 17:
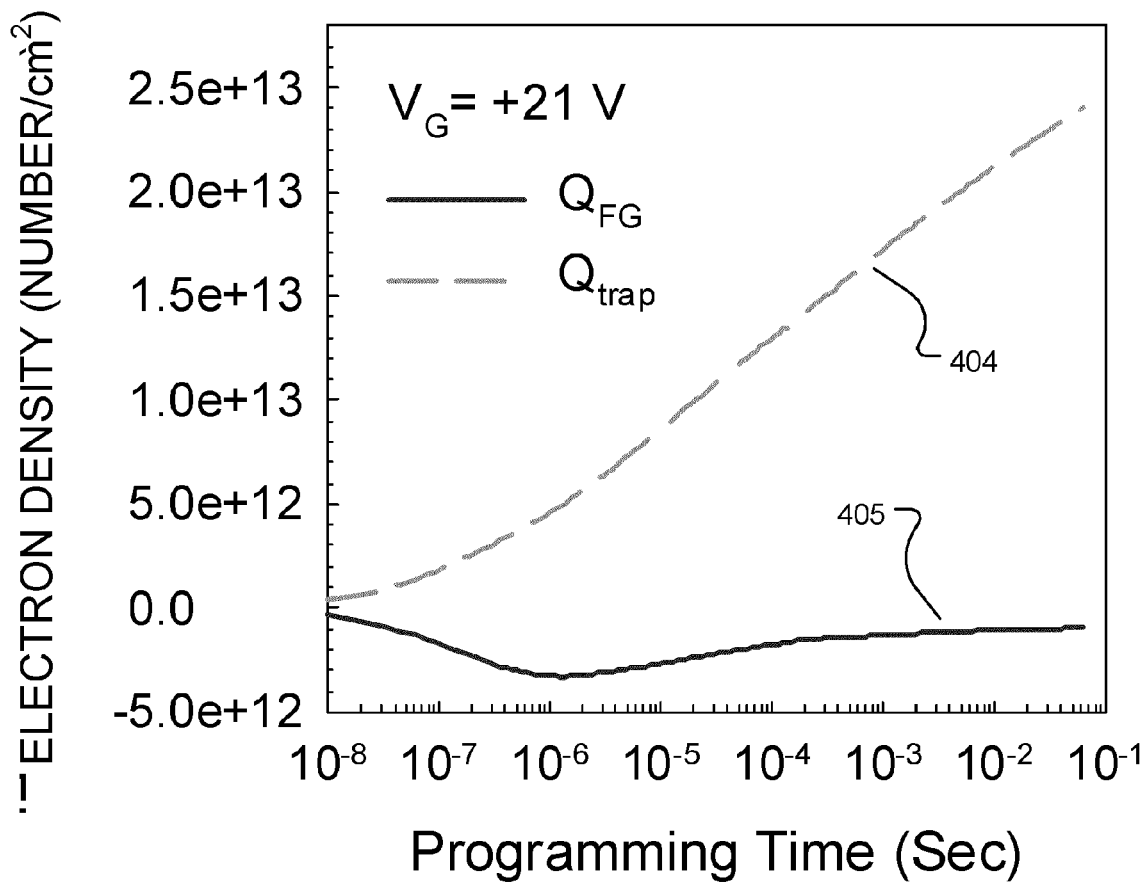
FIG. 17 is a graph showing results of simulation of concentration of trapped charge for programming operations for a charge trapping floating gate memory cell as described herein.

FIG. 17 is a graph showing calculated trapped electrons $Q_{trap}$ inside the dielectric charge trapping layer on trace 404, and the calculated trapped electrons $Q_{FG}$ inside the floating gate on trace 405, versus time under a programming bias of +21 V. The simulation shows that the charge trapped within a dielectric charge trapping layer is much greater than that trapped in the floating gate. This occurs because the tunneling efficiency of the bandgap engineered tunneling barrier layer between a floating gate and the dielectric charge trapping layer is much better than that of the tunneling barrier layer between the substrate and the floating gate.

Figure 18:
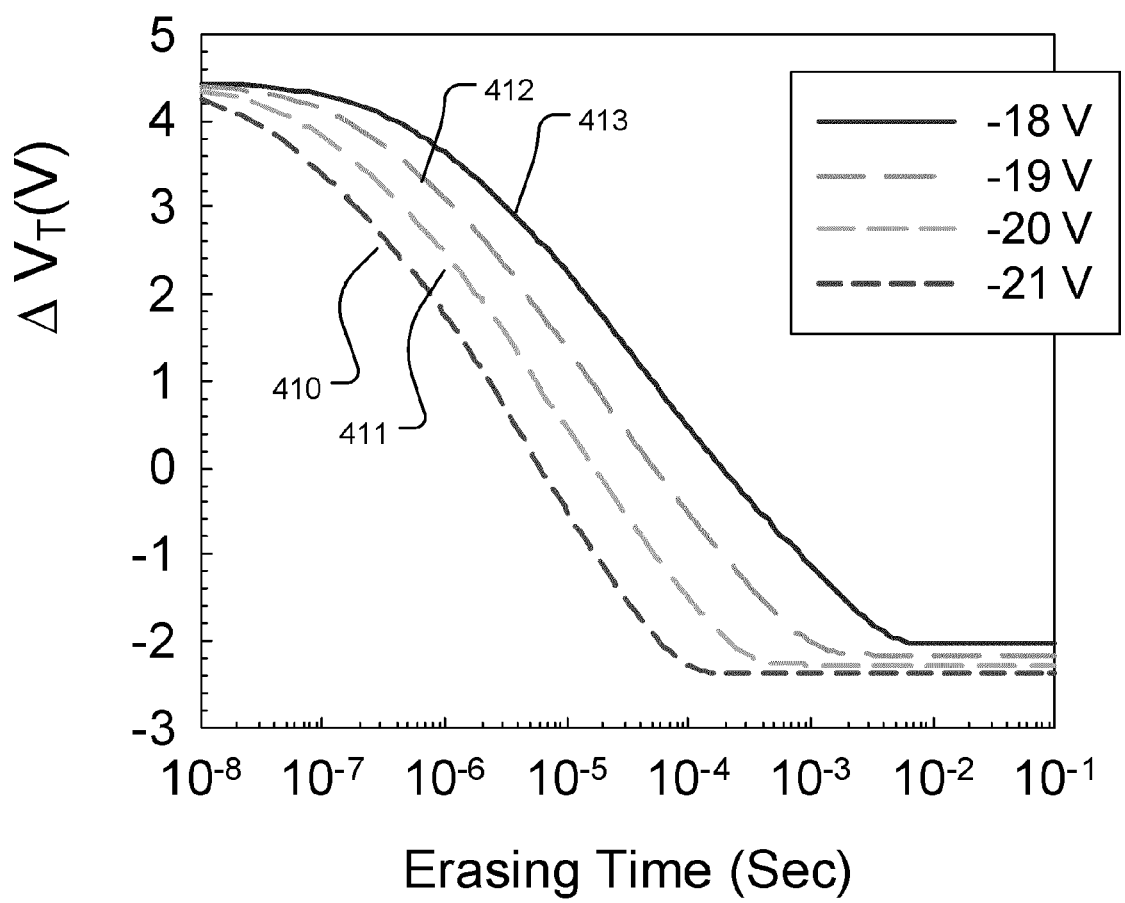
FIG. 18 is a graph showing the results of simulation of erasing operations for a charge trapping floating gate memory cell as described herein.

FIG. 18 is a graph showing the change in threshold voltage with time under an erasing bias from the gate to the substrate of the cell to induce Fowler-Nordheim tunneling, where the bias voltage is −21 V on trace 410, the bias voltage is −20 V on trace 411, the bias voltage is −19 V on trace 412, and the bias voltage is −18 V on trace 413. Therefore, the memory cell can be erased with reasonable erasing bias voltages in reasonable times.

Figure 19:
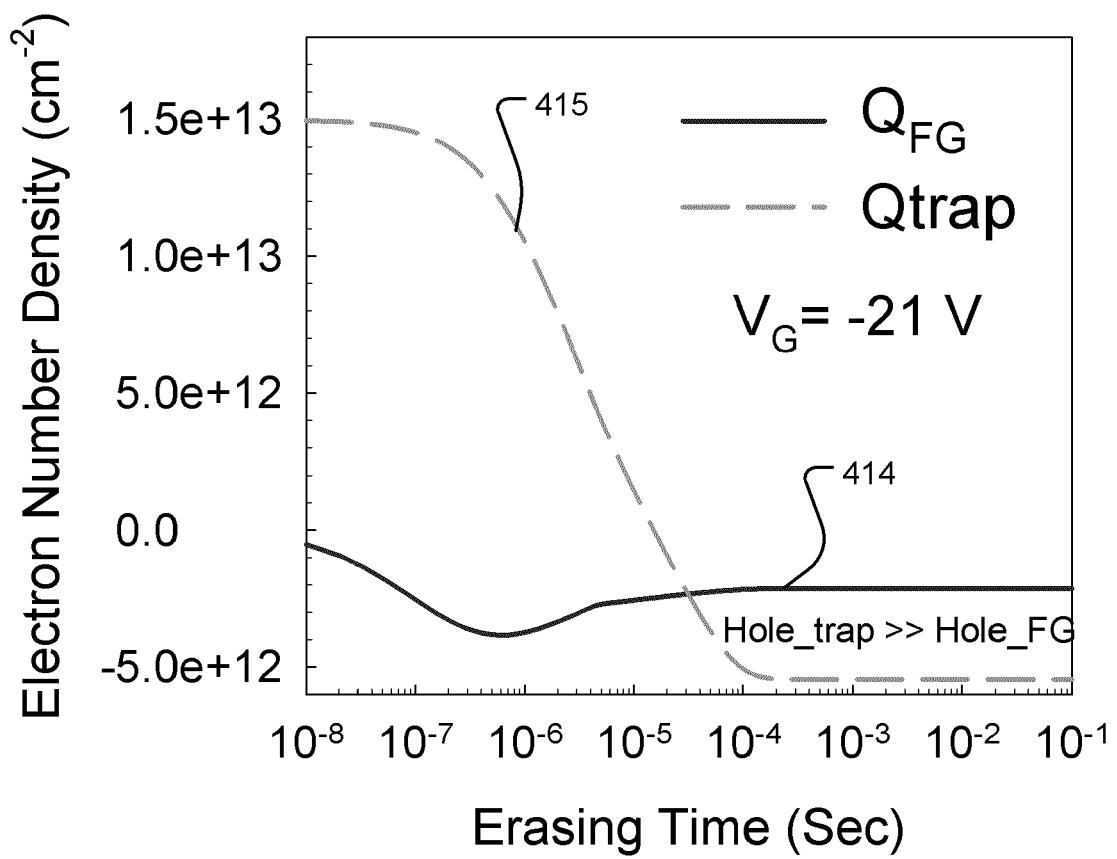
FIG. 19 is a graph showing results of simulation of concentration of trapped charge for erasing operations for a charge trapping floating gate memory cell as described herein.

FIG. 19 is a graph showing calculated trapped electrons $Q_{trap}$ inside the dielectric charge trapping layer on trace 415, and the calculated trapped electrons $Q_{FG}$ inside the floating gate on trace 414, versus time under an erasing bias of −21 V. The simulation shows that the charge trapped within a dielectric charge trapping layer is removed quickly, and that hole trapping in the dielectric charge trapping layer is much greater than that in the floating gate. This occurs because the tunneling efficiency of the bandgap engineered tunneling barrier layer between a floating gate and the dielectric charge trapping layer is much better than that of the tunneling barrier structure between the substrate and the floating gate. The simulation shows an erase saturation condition, because gate injection from the polysilicon wordline occurs after longer erase times.

The simulation shows that the charge trapped within a dielectric charge trapping layer is removed quickly, and that hole trapping in the dielectric charge trapping layer is much greater than that in the floating gate.

As illustrated by the simulations shown by FIGS. 17-19, the charge trapping/floating gate memory cell described herein provides a new operating condition unlike prior art devices. The floating gate establishes an equal potential region over the channel, and controls the threshold distribution across the channel. Even though the trapped charge may be non-uniform in the dielectric charge trapping layer, the channel is still controlled by the floating gate as an equipotential conductor. Therefore, the device can possess a near ideally parallel shift in the current/voltage curves during program and erase operations, which results from the fact that it is not controlled by local charge trapping at the edge of the device or by configurations of the edge of the shallow trench isolation structures. Therefore, it can be immune to the edge effect problems of prior art charge trapping dielectric based memory cells.

Also as illustrated by the simulations shown by FIGS. 17-19, most of the injected charge is stored inside the dielectric charge trapping layer, rather than inside the floating gate. As a result, the charge is stored in deep traps within the dielectric charge trapping layer, providing good data retention and good immunity from substrate induced leakage current SILC. In addition, because the polysilicon layer used to form a floating gate stores only small amounts of charge, the dielectric tunneling barrier layer between the floating gate and the substrate can be manufactured with a reduced thickness, such as less than the 7 nanometers typically considered required for floating gate flash memory. As mentioned above, the simulated cell used a tunneling barrier structure between the floating gate and the substrate of about 5 nanometers thick.

Therefore, the charge trapping floating gate memory device combines good features from both floating gate and charge trapping device technologies. Furthermore, the structure can be used to solve scaling and reliability issues encountered in both of these prior art types of flash memory devices.

Figure 20:
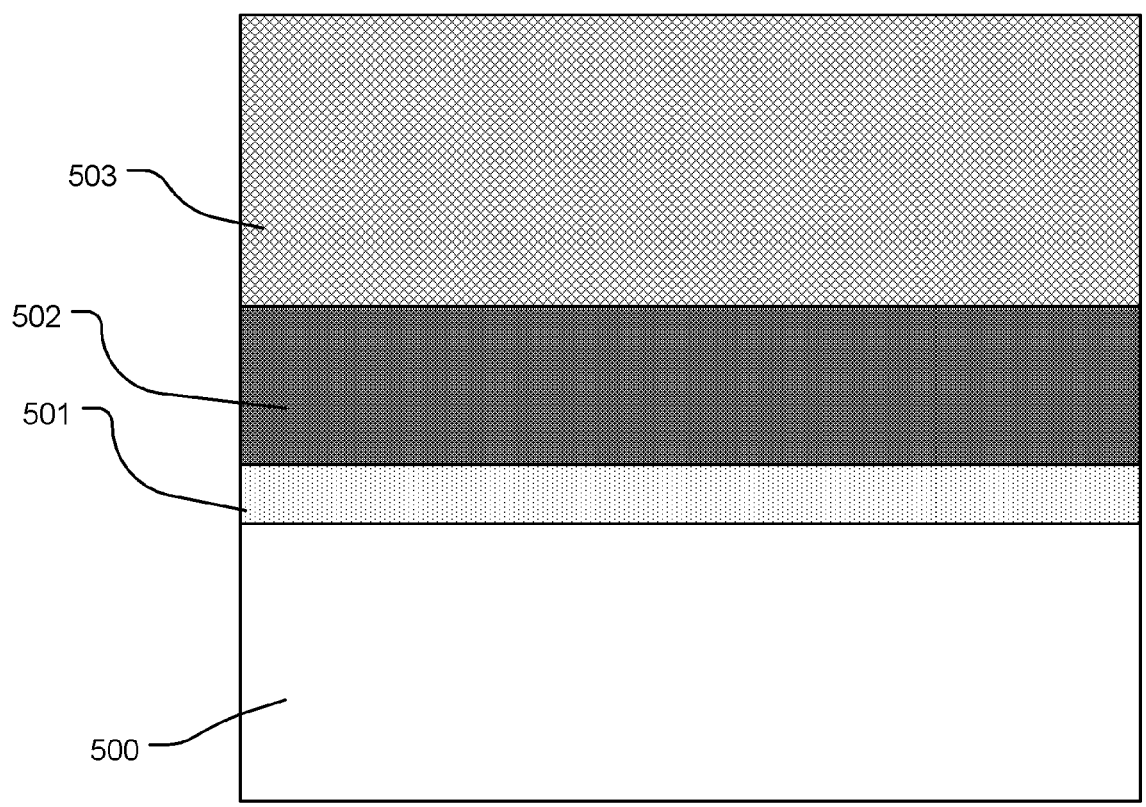
FIG. 20 illustrates a stage in a method for manufacturing a memory array comprising a first tunneling barrier structure and a floating gate polysilicon layer formed on a semiconductor substrate.

FIGS. 20-24 illustrate an embodiment of a process flow for manufacturing a NAND flash memory array, utilizing a charge trapping floating gate memory cell. A first stage in accordance with one embodiment of the manufacturing process is illustrated in FIG. 20, in which a stack of materials is formed on a semiconductor substrate 500. First, a tunneling barrier structure 501, which in this example comprises a layer of silicon dioxide between 5 and 7 nanometers thick, is formed on the surface of the substrate 500. Next, a polysilicon layer 502 is formed on the tunneling barrier structure 501. The polysilicon layer in representative embodiments is less than 100 nanometers thick, and can be on the order of 10 nanometers thick or less in order to achieve significant scaling of the device. In the embodiment illustrated in FIG. 20, next a hard mask layer 503 is formed over the polysilicon layer 502. In certain embodiments in which the hard mask layer 503 comprises silicon nitride, the thickness of the silicon nitride can be about 100 nanometers.

Figure 21:
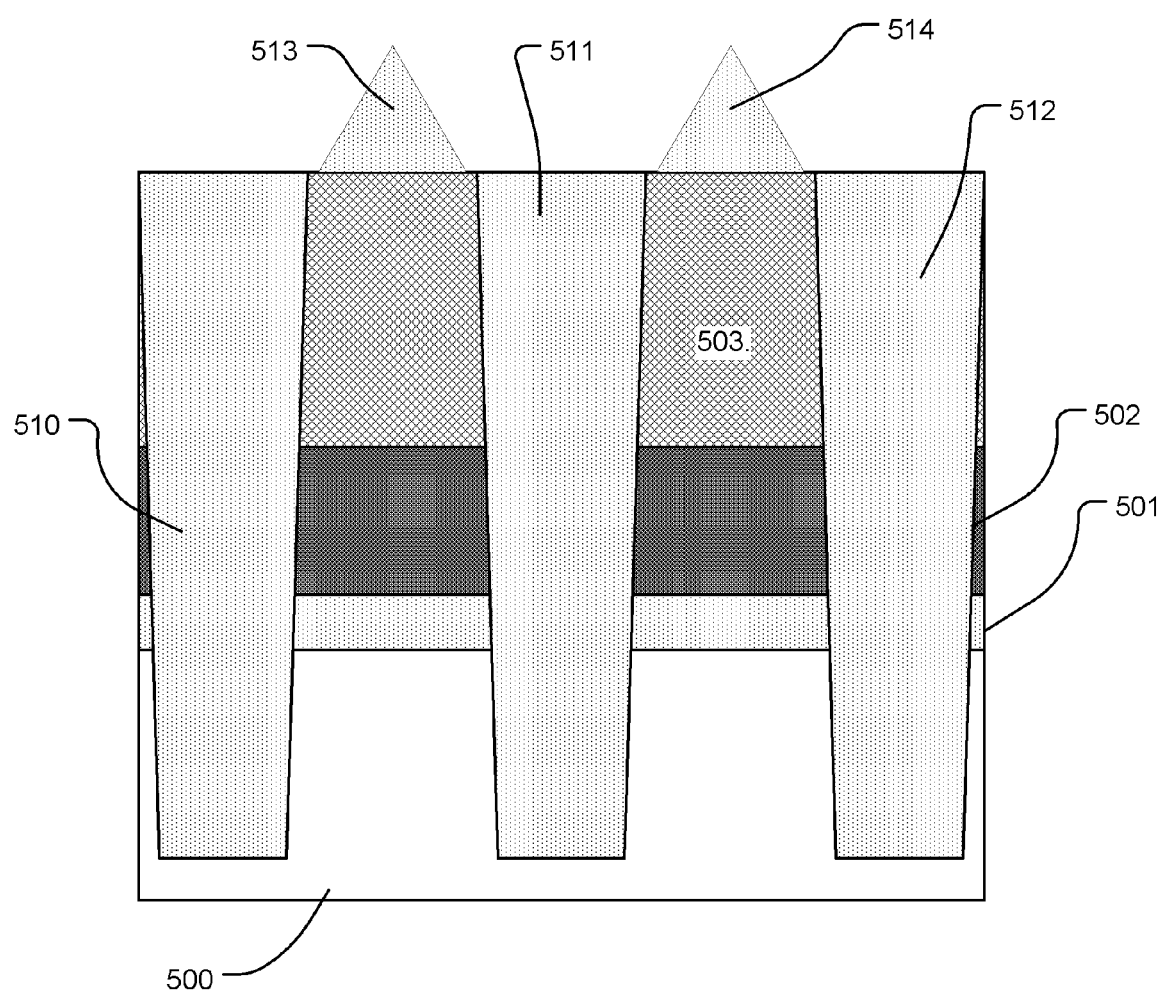
FIG. 21 illustrates a stage in the method for manufacturing a memory array comprising etching of isolation trenches and deposition of dielectric material in the isolation trenches into the substrate.

FIG. 21 illustrates a next stage in the manufacturing process in accordance with one embodiment of the process. In this stage, a photolithographic process or other pattern definition process can be used to define the locations of trench isolation structures. Trenches are then etched according to the pattern. The etch goes through the hard mask layer 503, the floating gate poly layer 502, and the tunneling barrier structure 501, and into the substrate 500 to define substrate trenches for isolating the columns of memory cells. Next, the gaps are filled with silicon dioxide or other dielectric material using, for example, a high density plasma HDP chemical vapor deposition technology resulting in the hat shaped structures 513, 514 on top of the hard mask layer between the trenches, and trench isolation structures 510, 511, 512 extending into the substrate 500. In certain embodiments the trench isolation structure extends into the substrate by about 200 nanometers.

Figure 22:
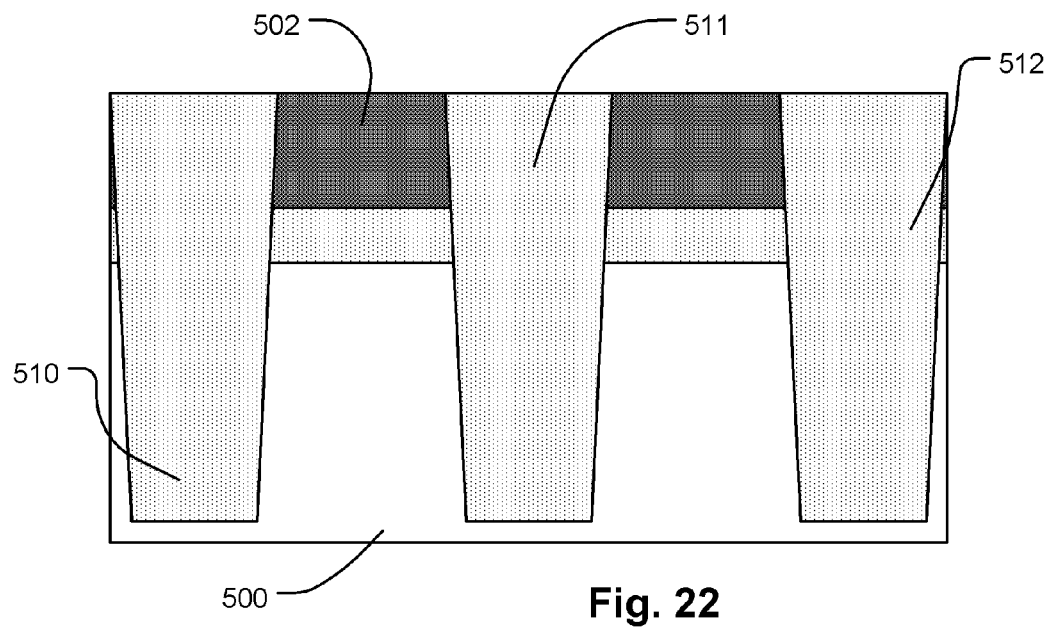
FIG. 22 illustrates a stage in the method for manufacturing a memory array comprising removal of excess oxide from the isolation trench deposition step, stripping of the hard mask layer, and removal of oxide from the floating gate polysilicon layer.

FIG. 22 illustrates a next stage in the manufacturing process. The embodiment illustrated in FIG. 22 comprises removal of any excess oxide from the trench isolation deposition process with, for example, chemical mechanical polishing CMP, stripping of the hard mask layer, and removal of oxide from the top of floating gate poly layer 502 with, for example, a wet hydrogen fluoride solution dip etch.

Figure 23:
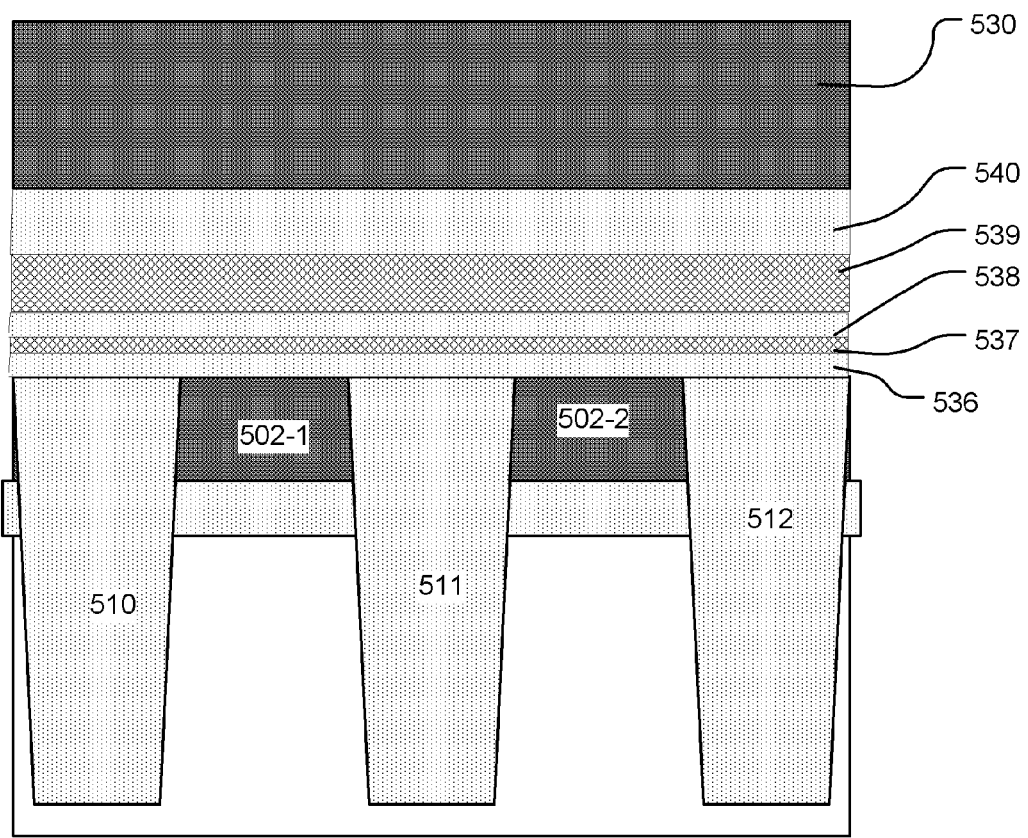
FIG. 23 illustrates a stage in the method for manufacturing a memory array comprising the formation of a stack of materials including a second tunneling barrier structure, a charge trapping layer and a blocking dielectric layer, as well as an additional top layer conductive material for the purpose of wordline definition.

FIG. 23 illustrates a next stage in the manufacturing process. In this stage, the formation of the layers 536-540 of dielectric used to define the charge trapping structure, and a wordline polysilicon layer 530 are completed. In the embodiment shown, a layer 536 of silicon dioxide preferably less than about 2 nanometers thick, a layer 537 of silicon nitride less than 3 nanometers thick, and preferably about 2.5 nanometers thick or less, and a layer 538 of silicon oxide preferably less than 3.5 nanometers thick, and preferably about 3 nanometers or less, are formed to provide the second tunneling barrier structure. A layer 539 of silicon nitride about 5 to 7 nanometers thick is formed to provide the charge trapping layer. A blocking dielectric layer 540 comprising silicon dioxide about 5 to 9 nanometers thick is formed next. A wordline polysilicon layer 530 is formed over the blocking dielectric layer 540.

The layer 530 is then cleaned in preparation for a lithographic step or other patterning step to define the wordlines of the array. The pattern for the wordlines is etched down at least through the floating gate polysilicon layer 502 to provide separated floating gates 502-1, 502-2 and to create rows of memory cells.

Figure 24:
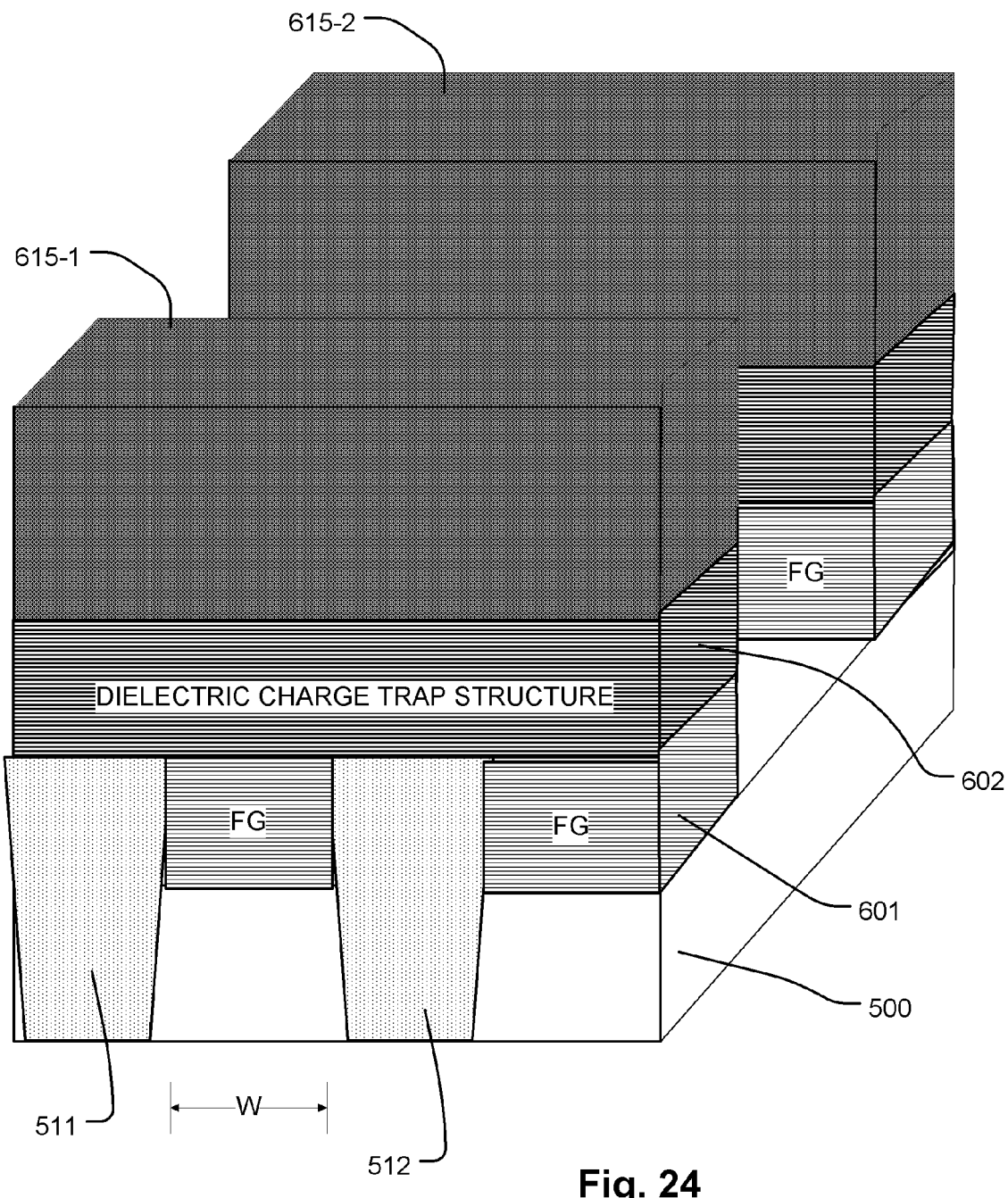
FIG. 24 illustrates a perspective view of a stage in the method for fabricating a memory array comprising memory cells as described herein with a combination of a floating gate structure and a dielectric charge trapping structure.

FIG. 24 illustrates in simplified perspective, a part of the resulting structure with a first wordline 615-1 and a second wordline 615-2 arranged along rows of memory cells. Source and drain terminals are then formed by implanting dopants between the wordlines, defining source and drain regions on opposite sides of the wordlines, and further processing including providing a dielectric fill between the wordlines to isolate the floating gates in the cells, metal layer patterning and so on is executed to finish the device. In FIG. 24, the structure is simplified to show the floating gate element 601 and the dielectric charge trapping element 602 as single units, in recognition that these portions can be made using different materials and combinations of thicknesses. See FIGS. 27-28 below for examples.

The near planar structure of the resulting devices enables scaling the pitch of the memory cells as the minimum feature sizes shrink for the manufacturing processes. Also, the combination of a floating gate with a dielectric charge trapping element, or stated alternatively, replacing the interpoly dielectric structure with a charge trapping dielectric element, is unlike any prior art devices. In the embodiments described, the charge trapping element is configured so that the tunneling efficiency from the floating gate to the charge trapping layer is much better than that between the substrate and the floating gate. Thus, bandgap engineered tunneling barrier structures are suitable for use in this structure. In addition, by providing a memory cell in which most of the charge is stored inside the dielectric charge trapping layer, good retention and reliability is achieved for the device. In addition, the channel of the device is directly controlled by the equi-potential floating gate. This provides DC characteristics like a conventional MOSFET.

The channel regions of the cells implemented as shown in FIG. 24 have a length between the source and drain regions (not shown) that is defined by the width of the wordline 615-1, reduced typically by diffusion of dopants during the implant processes. The width W of the channel is defined by the spacing between the STI structures 511, 512. The length and the width of the channel as defined here establish an area of the active region of the channel that is less than or equal to the width of the wordline 615-1 times the spacing between the STI structures.

The floating gate element 601 in the illustrated structure is substantially planar and has near equal areas on its top and bottom surfaces. The area of the floating gate element 601 is defined by the etching processes that set the spacing between the STI structures and the width of the wordlines. Thus, the areas of the top and bottom surfaces of the floating gate element 601 are substantially equal to one another, and substantially equal to the product of the width of the wordline and the spacing between the STI structures. Likewise, the area of the top contact for the cell in this embodiment is defined by the etching processes that set the spacing between the STI structures and the width of the wordlines. Thus, the areas of the bottom surface of the wordline acting as a top contact for the cell are substantially equal to the area of the top surface of the conductive layer, defined by the product of the width of the wordline and the spacing between the STI structures.

As can be seen from the perspective view in FIG. 24, the channel region of a representative memory cell as described herein manufactured with processes defining critical features less than 45 nanometers, has a length between the source and the drain of less than 45 nanometers, and a width orthogonal to the length of less than 45 nanometers.

Representative embodiments manufactured with processes defining critical features less than 30 nanometers, have a length between the source and the drain of less than 30 nanometers, and a width orthogonal to the length of less than 30 nanometers, and the multilayer stack has an effective oxide thickness of about 20 nanometers or less, and the channel region a width orthogonal to the length less than 1.5 times the effective oxide thickness of the multilayer stack.

In a representative embodiment, the channel width W of the memory cell is less than 45 nanometers. The effective oxide thickness EOT (actual thickness scaled as a function of the dielectric constant of silicon dioxide divided by the dielectric constant of the material) of the charge trapping element 602 of the memory cell can be on the order of 15 to 25 nanometers. For memory cells having this structure, the channel width may be less than about 1.5 times of the effective oxide thickness of the charge trapping element 602 of the memory cell calculated as the EOT of the combination of the tunneling barrier structure, the charge trapping structure and the top dielectric layer, and more preferably about equal to the effective oxide thickness for the memory cell. Embodiments having a channel width as low as 20 nanometers or less, and less than the EOT of the memory cells can be implemented using photoresist trimming techniques, phase shift masking, or other sublithographic patterning technologies.

In certain embodiments, the memory cells can be configured in NAND arrays with channel widths less than 45 nanometers, and preferably on the order of the EOT of the multilayer stack.

Memory cells as described herein can be implemented in other array structures as well. For example, array structures using charge trapping/floating gate memory cells as described herein can be implemented in NOR configurations and in AND configurations. In addition, memory arrays using the charge trapping/floating gate memory cells as described herein can be implemented using thin-film transistor TFT techniques and silicon-on-insulator techniques such as described for example in our commonly owned and co-pending U.S. Patent Publication No. 2008/0175053, published on 24 Jul. 2008 (application Ser. No. 12/056,489, filed 27 Mar. 2008, (MXIC 1846-1)) which is incorporated by reference as if fully set forth herein.

The manufacturing process is very similar to that applied for current floating gate flash memory technologies, altered however to provide a thin polysilicon layer for the floating gate and a near-planar interpoly dielectric charge trapping structure. Accordingly, it should be understood that it is easily adaptable to a wide variety of array structures. In addition, it should be understood that the floating gate/charge trapping memory device can be implemented in both p-channel and n-channel technologies.

Figure 25:
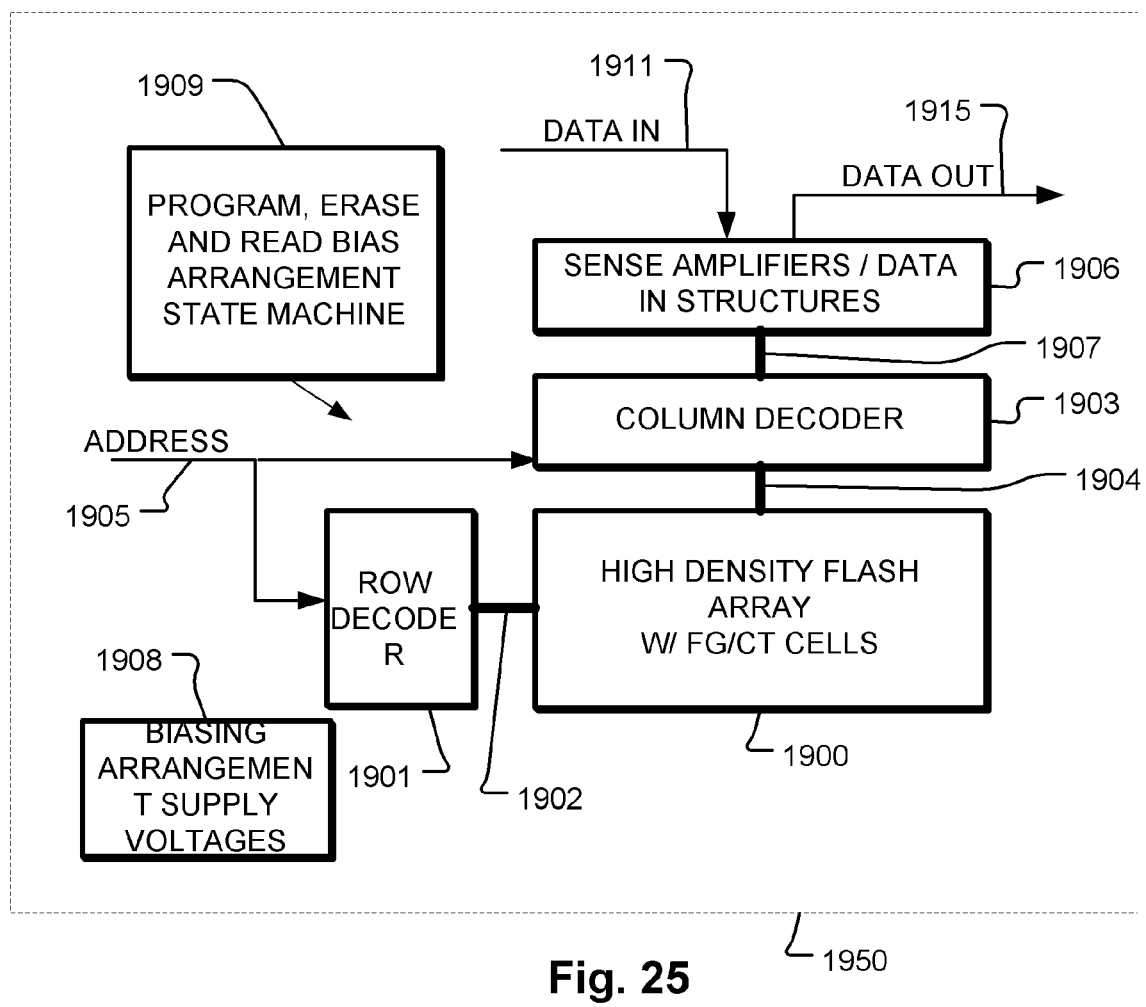
FIG. 25 is a simplified diagram in accordance with one embodiment of an integrated circuit with an array of charge trapping floating gate CTFG memory cells and control circuitry.

FIG. 25 is a simplified diagram of an integrated circuit with an array of charge trapping floating gate CTFG memory cells. The integrated circuit 1950 includes a memory array 1900 implemented using non-volatile CTFG memory cells, as described herein, on a semiconductor substrate. The memory cells of array 1900 may be interconnected in parallel, in series, or in a virtual ground array. A row decoder 1901 is coupled to a plurality of wordlines 1902 arranged along rows in the memory array 1900. Memory cells as described herein can be configured in NAND arrays, and NOR arrays, or other types of array structures. A column decoder 1903 is coupled to a plurality of bitlines 1904 arranged along columns in the memory array 1900. Addresses are supplied on bus 1905 to column decoder 1903 and row decoder 1901. Sense amplifiers and data-in structures in block 1906 are coupled to the column decoder 1903 via data bus 1907. Data is supplied via the data-in line 1911 from input/output ports on the integrated circuit 1950, or from other data sources internal or external to the integrated circuit 1950, to the data-in structures in block 1906. Data is supplied via the data-out line 1915 from the sense amplifiers in block 1906 to input/output ports on the integrated circuit 1950, or to other data destinations internal or external to the integrated circuit 1950. A bias arrangement state machine 1909 controls the application of bias arrangement supply voltages 1908, such as for the erase verify and program verify voltages, and the arrangements for programming, erasing, and reading the memory cells. The array may be combined on the integrated circuit with other modules, such as processors, other memory arrays, programmable logic, dedicated logic etc.

Figure 26:
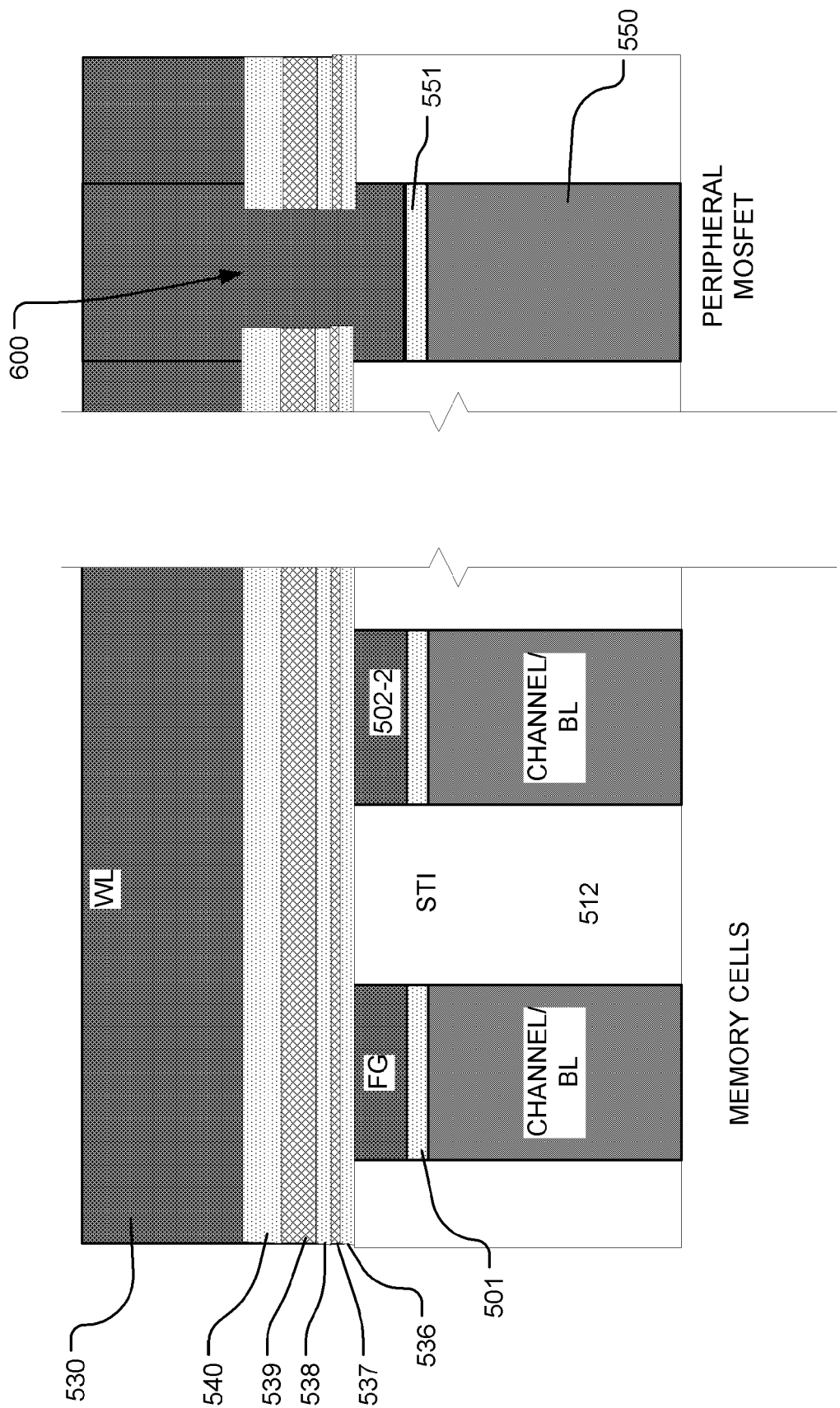
FIG. 26 illustrates a manufacturing stage integrating the process for making the memory cells as described herein with transistors in peripheral circuitry.

FIG. 26 illustrates the efficient manner in which memory cells manufactured as described herein can be integrated with CMOS devices used in peripheral circuitry. In FIG. 26, memory cells like those shown in FIG. 23 are shown, with the same reference numerals. On the right hand side, a peripheral MOSFET is illustrated. As can be seen, the peripheral MOSFET has a channel body 550 which can be defined and patterned at the same time as the channel/bitline structures in the memory cells. Likewise, the peripheral MOSFET has a gate dielectric layer 551 which can be laid down at the same time as the tunneling barrier structure 501 is formed in the memory array area. For process integration, the stack of layers 536-540 used for formation of the charge trapping structure over the floating gate 502-1 is formed in a blanket process covering both the array and peripheral areas. In the peripheral areas, a lithographic process or other patterning process is used to form contact openings, such as opening 600 through the stack of layers 536-540. At the time of deposition of the polysilicon for the wordline 530 in the array, the polysilicon fills the contact openings, connecting the first polysilicon layer, that is used to form the floating gate in the memory cells, to the second polysilicon that is used to form the wordlines in the memory cells, and to form the transistor gate structures and interconnects in the peripheral MOSFETs. Thus, the manufacturing process requires only one additional patterning step to define contact openings 600, in order to fully integrate the memory cells with peripheral circuits. The resulting MOSFET, can be used also as a local bitline select transistor in the memory array, coupling the local bitline to global metal bitlines.

Peripheral CMOS circuits often require multiple gate oxide thicknesses and implementation. Thick and thin gate oxides can be integrated in the process by a technique such as first forming thick oxide over the device, applying a pattern to defined regions where the thick oxide is desired, and removing the thick oxide outside the pattern. After removing the thick oxide, a thin oxide can be grown, such as the tunneling barrier structure 501 and thin gate oxide for the gate dielectric layer 551. The thickness of the thick oxide will be almost unchanged during growth of the thin oxide.

Figure 27:
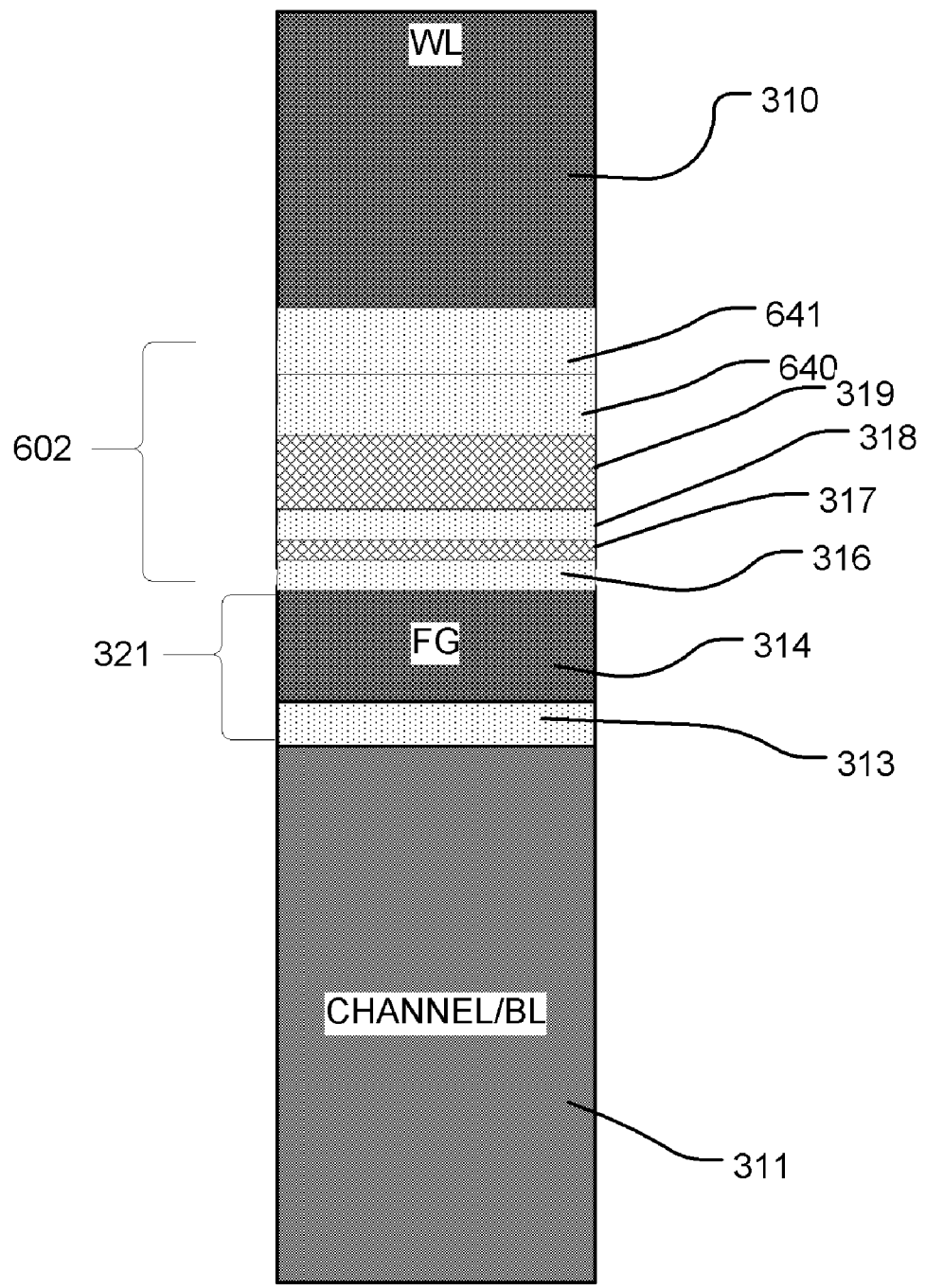
FIG. 27 illustrates an alternative charge trapping floating gate structure using a high-K capped buffer oxide blocking dielectric layer.

FIG. 27 illustrates an alternative charge trapping floating gate memory cell in which the charge trapping dielectric element 602 is modified relative to the charge trapping dielectric stack 322 in FIG. 14, to provide a blocking dielectric layer in this embodiment comprising a stack including a buffer layer 640 and a high-κ capping layer 641. The reference numerals used in FIG. 27 match those used in FIG. 14, where appropriate. High-κ herein refers to dielectric constant >7, such as found in materials including $Al_2O_3$, $HfO_2$, $ZrO_2$, $La_2O_3$, AlSiO, HfSiO and ZrSiO etc.

The buffer layer 640 of silicon dioxide can be formed by wet conversion from the nitride by a wet furnace oxidation process. Other embodiments may be implemented using high temperature oxide (HTO) or LPCVD $SiO_2$. An aluminum oxide capping dielectric layer 641 can be made by atomic vapor deposition, with a post rapid thermal anneal at about 900° C. for 60 seconds to strengthen the film.

Using these processes, a layer of silicon oxide (which can be formed with very few defects), and a capping layer of high-κ, high conduction band offset material like aluminum oxide, combine to provide a blocking dielectric layer which provides excellent retention characteristics and very low erase saturation voltages. Therefore, the EOT can be reduced and the operation voltage can be lowered.

Also, it is found that the ratio of the thickness of the top layer 641 to the thickness of the bottom layer 640 of the blocking dielectric layer can be less than 2 for the combination of silicon oxide ($κ_1$=3.9) and aluminum oxide ($κ_2$=about 8). In general, the top layer 641 can have a thickness that is less than the ratio of the dielectric constants (8/3.9) times the thickness of the bottom layer 640. Thus, the blocking dielectric layer as described herein includes a first layer 640 having a dielectric constant $κ_1$ contacting the charge trapping dielectric layer and a second layer 641 contacting another one of the channel surface and the gate, the second layer 641 having a dielectric constant $κ_2$ higher than $κ_1$ of the first layer, and the second layer having thickness less than $κ_2/κ_1$ times that of the first layer. Since the barrier height of $Al_2O_3$ is almost the same as $SiO_2$, the electron barrier height or conduction band offset of aluminum oxide with N+ polysilicon gate is about 3.1 eV. In general, according to this embodiment, the second layer has a dielectric constant $κ_2$ higher than $κ_1$ of the first layer, and the second layer has a thickness less than $κ_2/κ_1$ times that of the first layer. The structure of FIG. 27 offers lower gate injection current during a negative bias Fowler Nordheim erase process while maintaining good retention.

Figure 28:
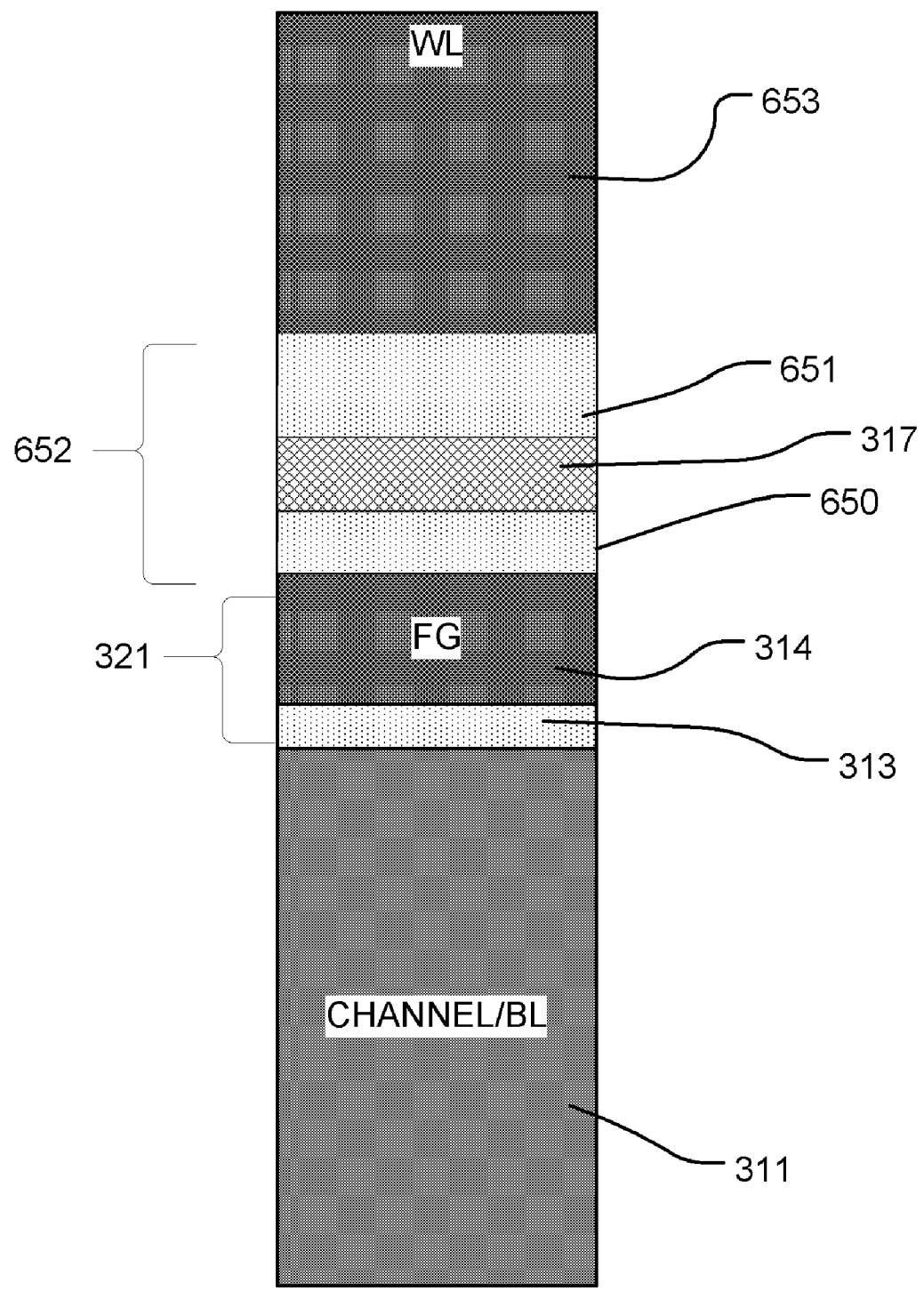
FIG. 28 illustrates an alternative charge trapping floating gate structure using an aluminum oxide blocking layer and high work function gate material.

Another alternative is shown in FIG. 28, in which the charge trapping dielectric stack 652 is substituted for the stack in FIG. 14, replacing both the tunneling barrier structure 315 and the blocking dielectric layer 320. The second tunneling barrier structure 650 is implemented with a single layer tunneling oxide as used in conventional MONOS devices, or with other tunneling barrier structures. In this embodiment, the tunneling barrier structure 650 must have a lesser barrier to tunneling than the first tunneling barrier structure 313, as discussed above, such as by being implemented using silicon dioxide with a thickness less than 3 nanometers for example. In addition, the blocking dielectric layer 651 is implemented with a high-κ material such as aluminum oxide. The wordline layer 653 is also implemented with a material such as TaN, or other high work function material, emphasizing alternative materials relative to the wordline 310 of FIG. 14. Resulting structures commonly known as MANOS/TANOS structures are provided in place of the interpoly dielectric over the floating gate.

FIGS. 29-38 show results of testing an FG-BE-SONOS device, in which the first tunneling barrier structure is silicon oxide (~54 Å thick) formed by in situ steam generation ISSG, the floating gate is undoped polysilicon (~40 Å thick), the second tunneling barrier structure is a bandgap engineered structure with O1/N1/O2 having respective thicknesses of about 13 Å, 20 Å, and 25 Å, the charge trapping dielectric layer is silicon nitride about 50 Å thick and the blocking dielectric layer is silicon oxide about 40 Å thick. A self-aligned STI structure was fabricated to isolate the floating gate poly in both STI and WL directions. The device tested was a large area device, which allows monitoring of intrinsic characteristics without edge effects while demonstrating the viability of the structure.

Figure 29:
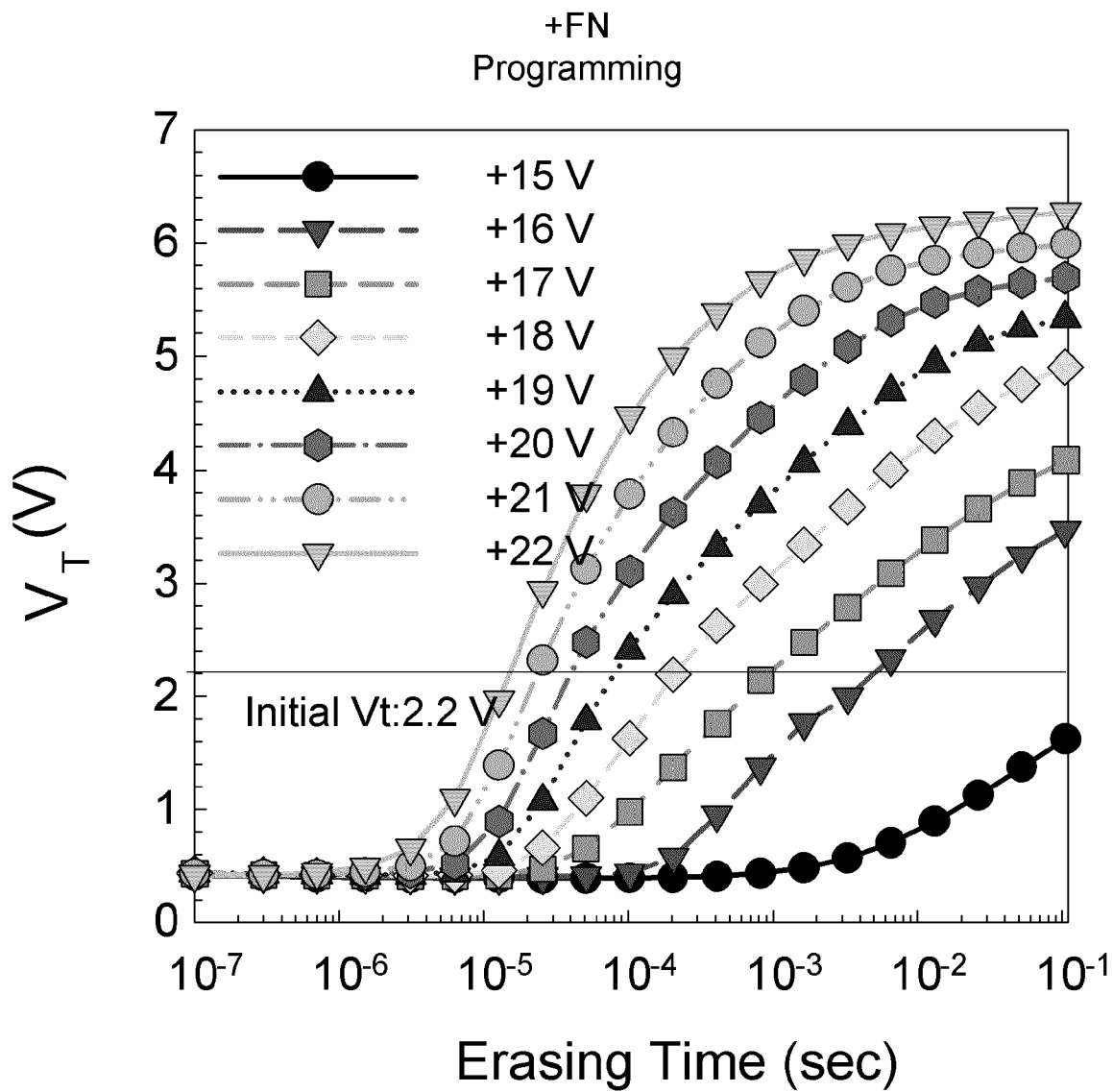
FIG. 29 is a graph showing results of testing positive voltage Fowler Nordheim FN programming operations with a charge trapping floating gate memory device as described herein.

FIG. 29 shows results of testing under +FN programming bias ranging from +15V to +22V. The initial threshold voltage Vt of the device was about 2.2 V. The threshold saturates at a level about 6 V in the tested sample. As can be seen, the cell can be programmed to a level greater than 4 V very quickly in under 10 ms, under bias conditions of less than +18 V. Even faster programming speeds can be achieved with higher electric fields.

Figure 30:
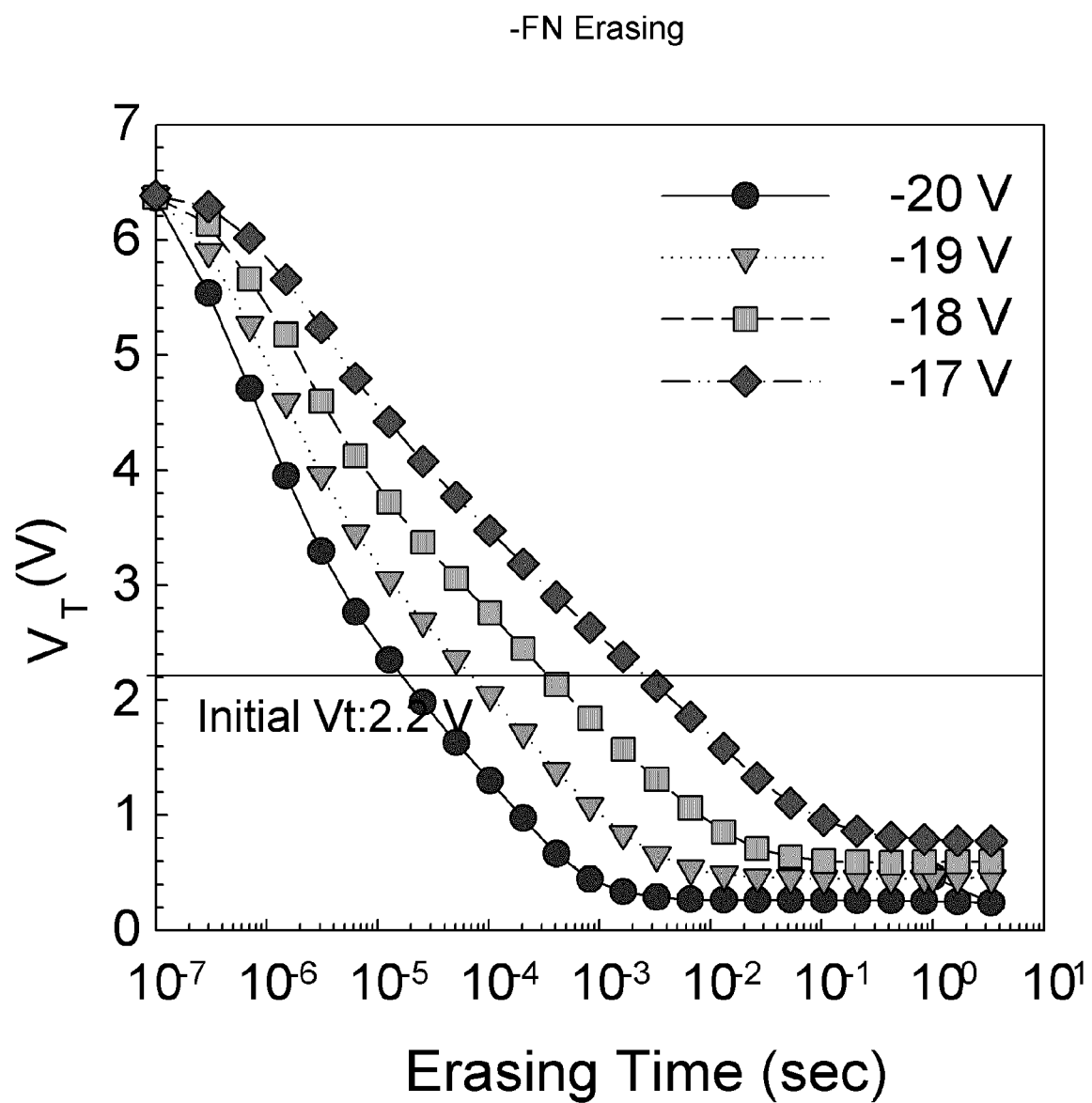
FIG. 30 is a graph showing results of testing negative voltage Fowler Nordheim FN erasing operations with a charge trapping floating gate memory device as described herein.

FIG. 30 shows results of testing under negative FN erasing bias ranging from −17 V to −20 V. The erased state can be about 2 V lower than the initial threshold. Erase saturation occurs in this device at a threshold voltage of about 0 V. The device can be erased to a threshold level less than 1 V under negative voltage bias conditions having magnitudes less than 18 in less than 100 ms. Even faster erasing rates can be achieved with higher electric fields.

Figure 31:
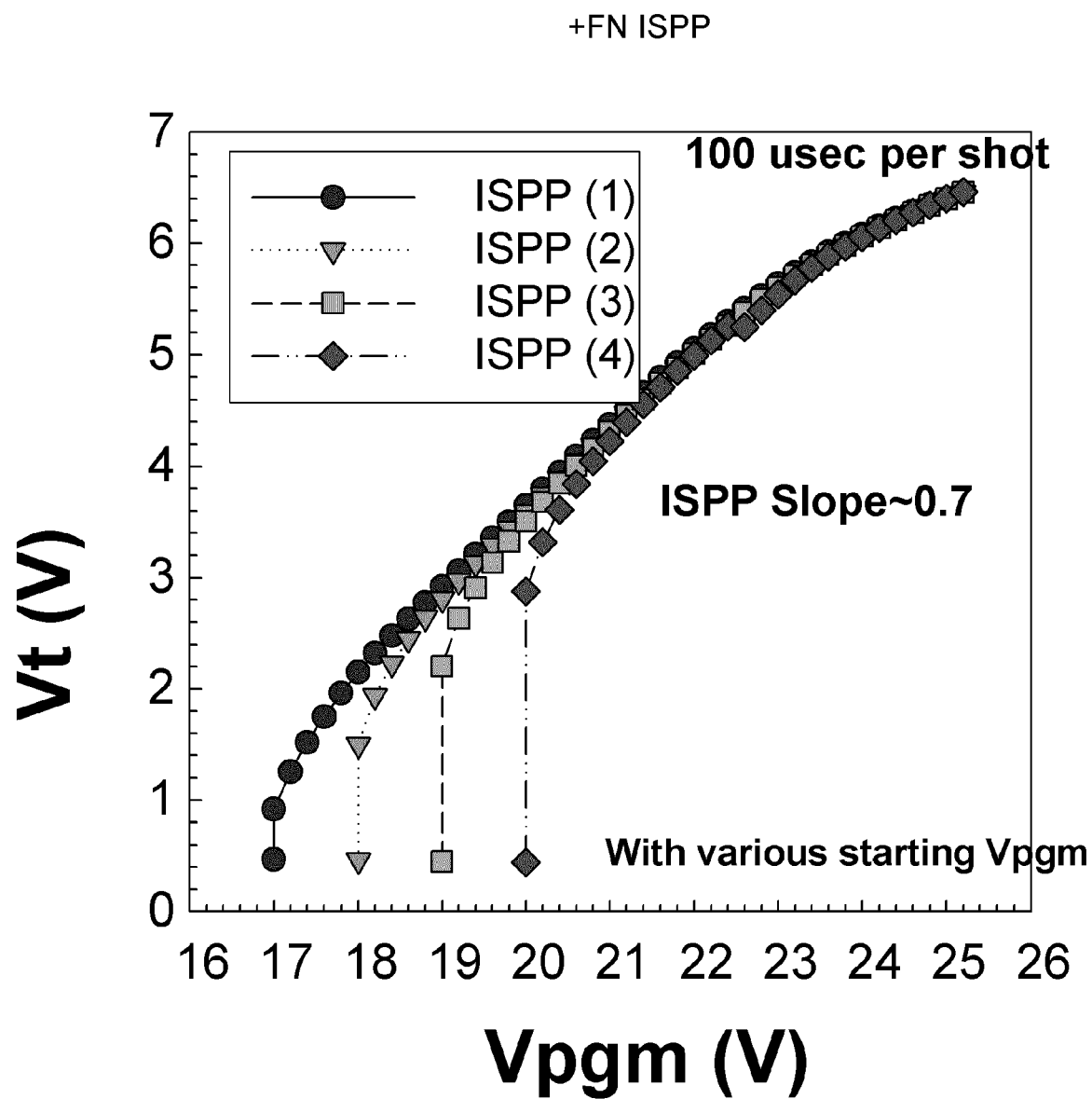
FIG. 31 is a graph showing results of testing incremental step pulse programming ISPP operations with the charge trapping floating gate memory device as described herein.

FIG. 31 illustrates the results of +FN incremental step pulse programming ISPP for the tested device, with starting program pulse magnitudes in a range of 17 to 20V, using 100 µs pulses per increment. The ISPP sloped is about 0.7 in this example. Generally, the tested device required a relatively high voltage on the order of 25 V to achieve a threshold voltage greater than 6 V. Also, the ISPP programming turns on at a relatively higher program potential at greater than 16 V compared to standard bandgap engineered SONOS, in which the ISPP programming turns on at potentials on the order of 12 V. This relatively higher voltage operation results from the larger effective oxide thickness of the structure, considering the EOT of the BE-SONOS structure of about 13 nanometers, the EOT of the tunneling barrier structure beneath the floating gate which consist of silicon dioxide of about 5 nanometers, and the effective oxide thickness of the floating gate in the depletion mode.

Figure 32:
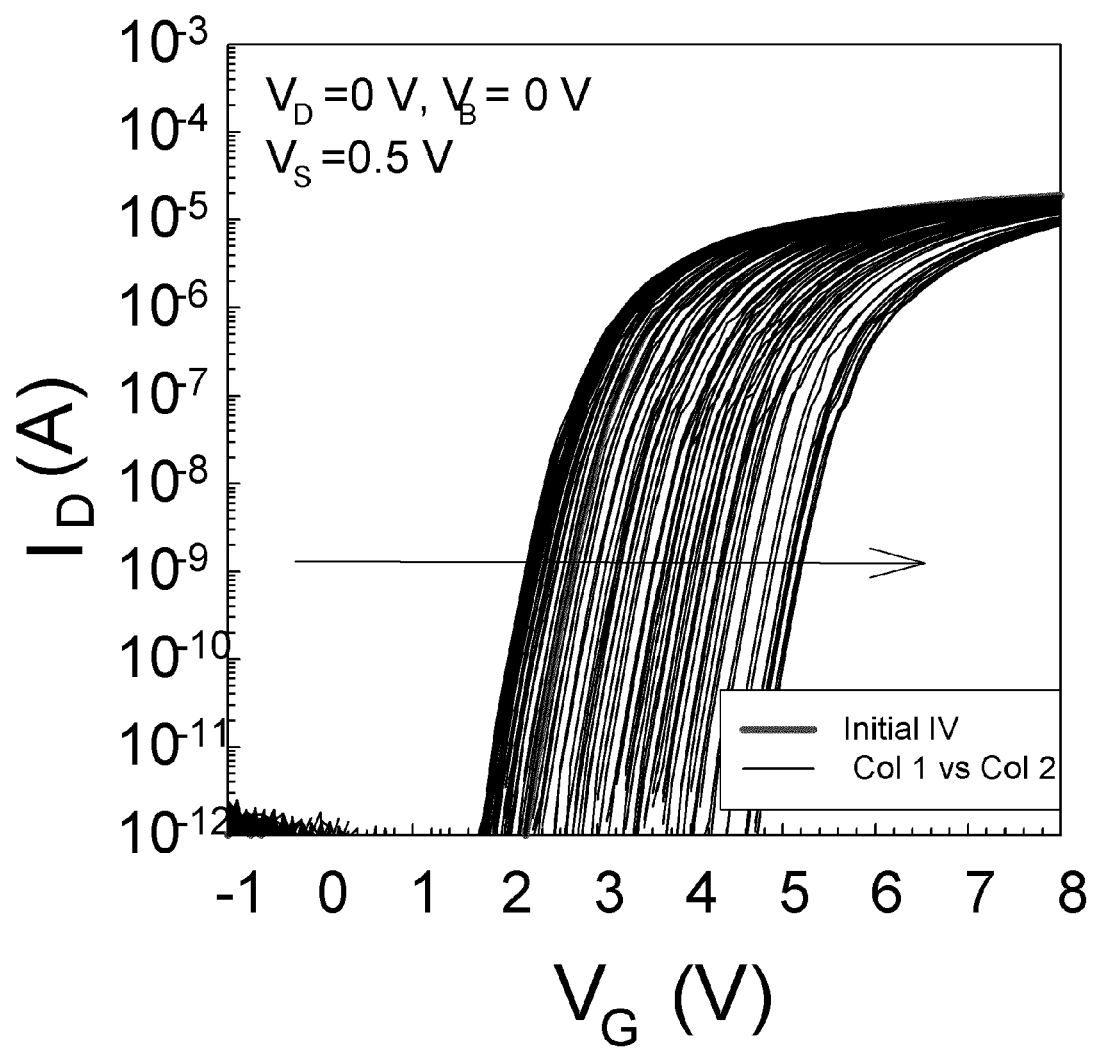
FIG. 32 is a graph of gate voltage versus drain current generated by testing a charge trapping floating gate memory device having a first length and width, as described herein under shifting threshold voltages.
Figure 33:
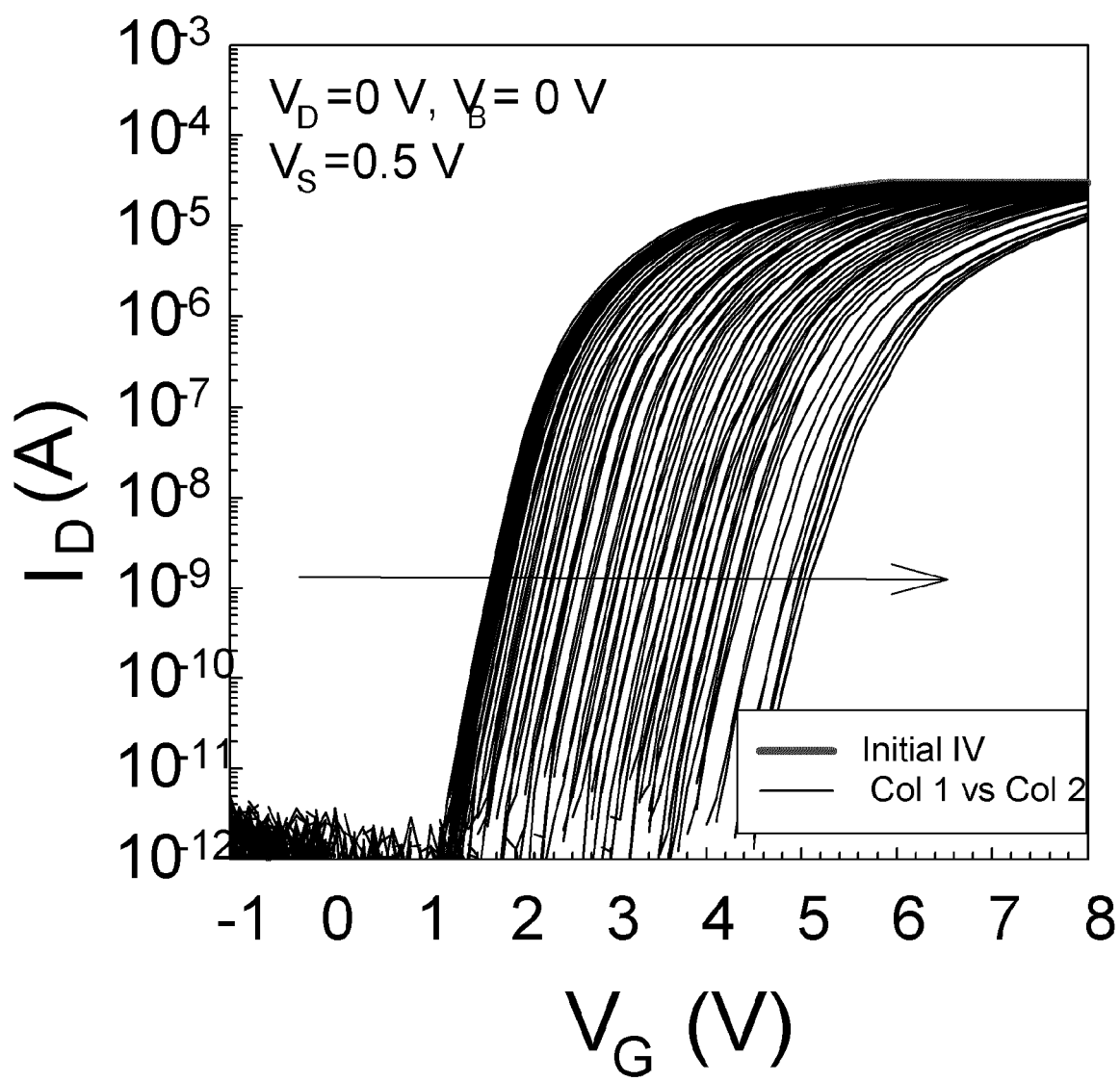
FIG. 33 is a graph of gate voltage versus drain current generated by testing a charge trapping floating gate memory device having a second length and width as described herein under shifting threshold voltages.

FIGS. 32 and 33 illustrate the drain current versus gate voltage IV curves for a first cell having a length of about 0.2μ and a width of about 0.07μ, and a second cell having a length of about 0.2μ and a width of about 0.15μ, respectively. In the testing, the drain and the body were grounded while the source was coupled to a potential of about 0.5 V. The IV curve at the initial threshold voltage is not decipherable in the figure. However, it is substantially parallel to all of the other lines, starting at a threshold of about 2.2 V. As can be seen by the data shown in these figures, the IV curves shift in parallel during the program and erasing operations.

Figure 34:
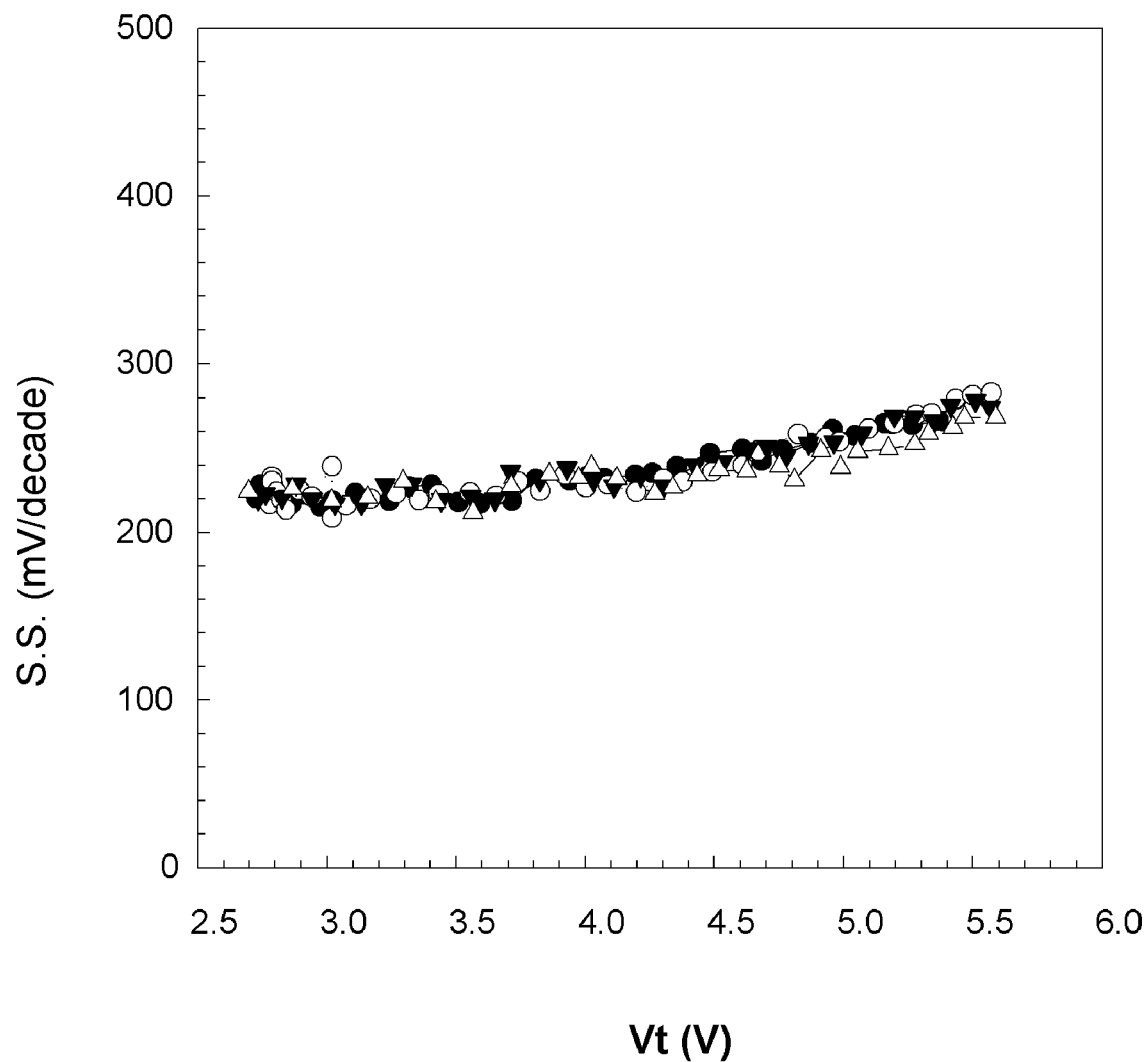
FIG. 34 is a graph showing results testing subthreshold shift for a charge trapping floating gate memory device as described herein.

FIG. 34 illustrates the sub-threshold shift for the tested memory cell. As can be seen, there is very small variation in subthreshold shift SS across a large range of threshold voltage.

Figure 35:
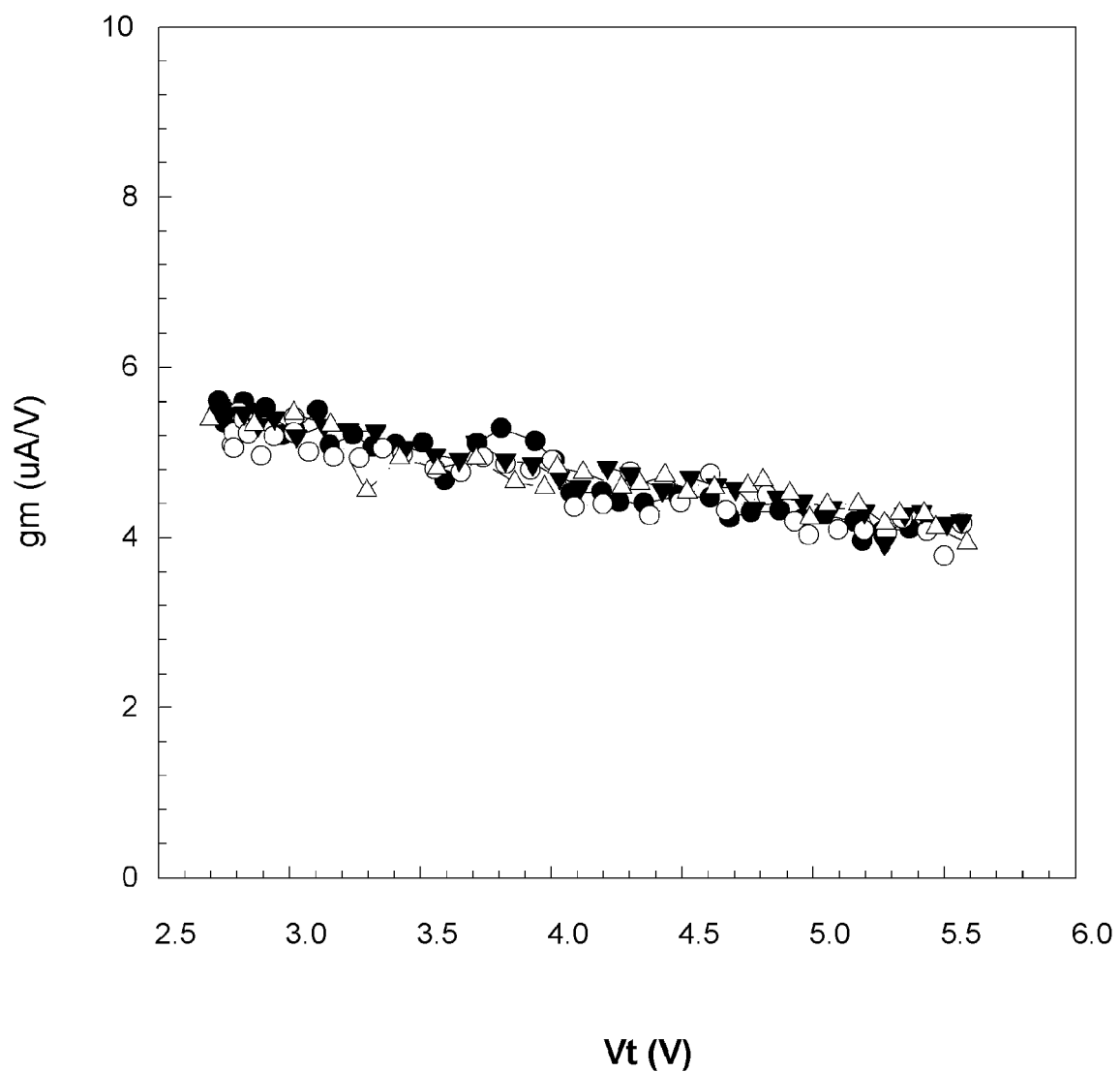
FIG. 35 is a graph showing results of testing transconductance for a charge trapping floating gate memory device as described herein.

FIG. 35 illustrates the variation in transconductance $g_m$ across threshold voltage. The variations in subthreshold shift and transconductance are relatively smaller than seen in a standard BE-SONOS cell. This effect is believed to be a result of the fact that the floating gate in the charge trapping floating gate cell provides an equipotential plane, canceling edge effects that occur in the standard dielectric charge trapping cell.

Figure 36:
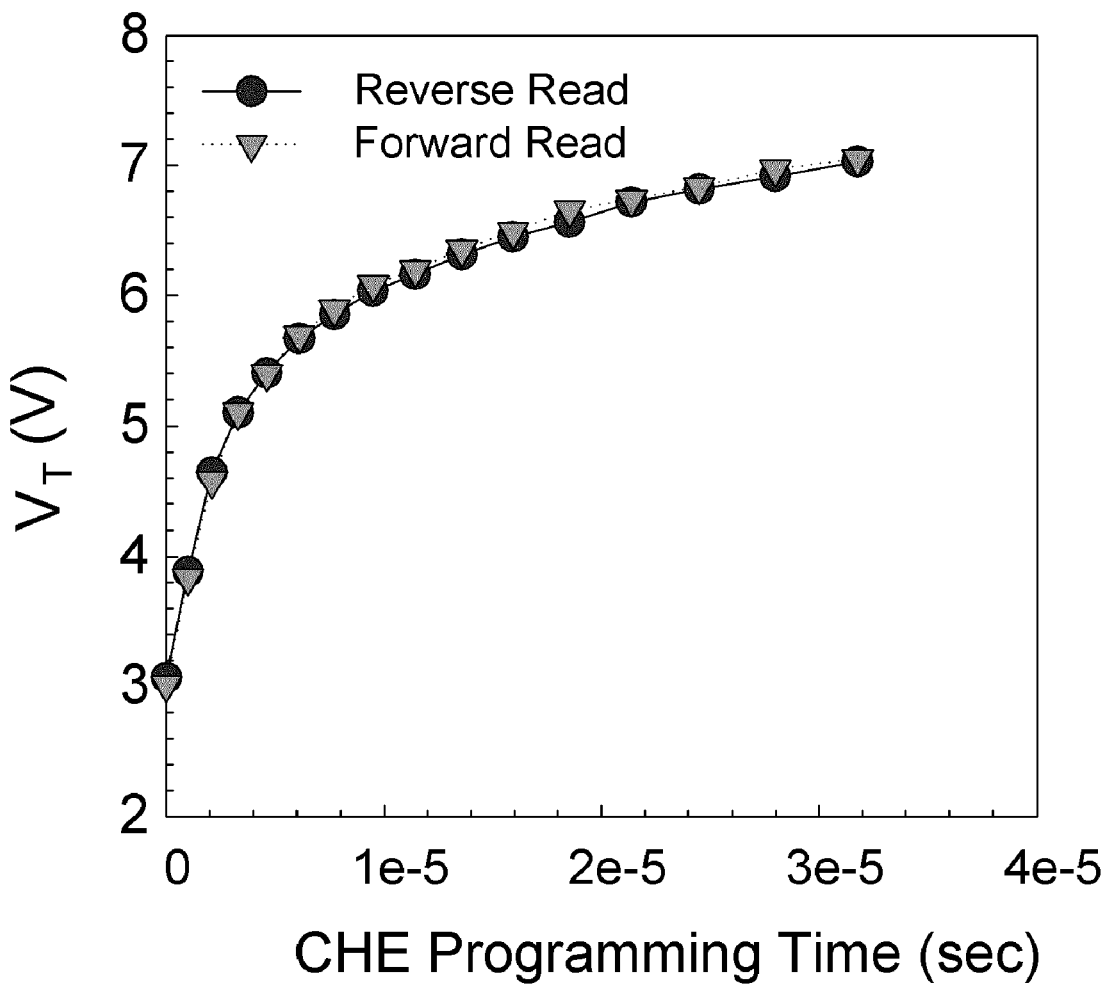
FIG. 36 is a graph of channel hot electron programming time versus threshold voltage, with threshold voltage being sensed with both reverse and forward read operations and a charge trapping floating gate memory device as described herein.

FIG. 36 illustrates the performance of the tested cell under channel hot electron CHE programming bias using stepped gate voltages and stepped drain voltages, starting at a gate voltage of 8 V and a drain voltage of 4 V, with one microsecond pulses and a 0.1 V steps. After the programming, a reverse read and forward read are applied to the cell.

Figure 37:
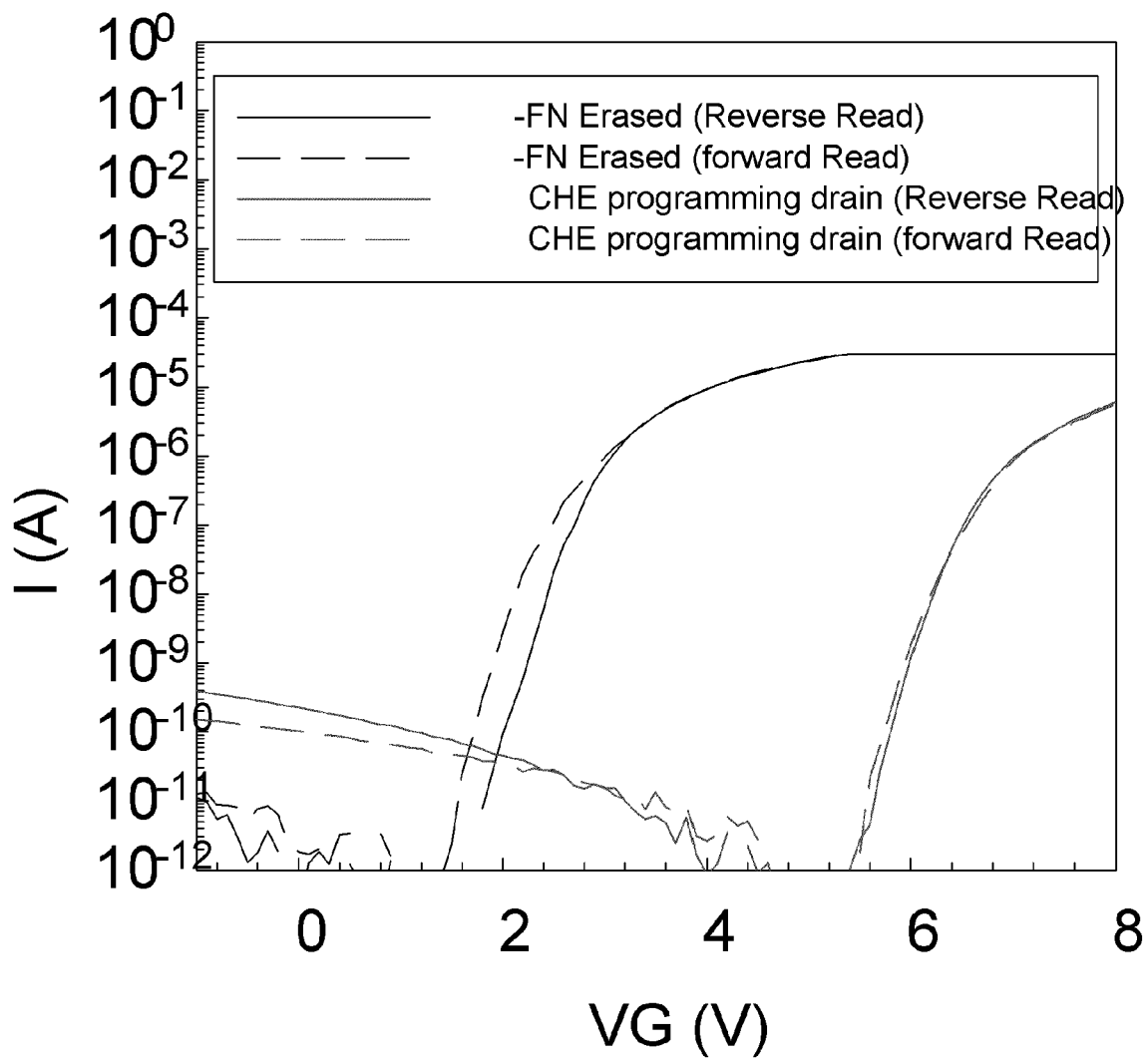
FIG. 37 is a graph on a logarithmic scale of gate voltage versus drain current for a charge trapping floating gate memory device as described herein in both erased and programmed conditions.
Figure 38:
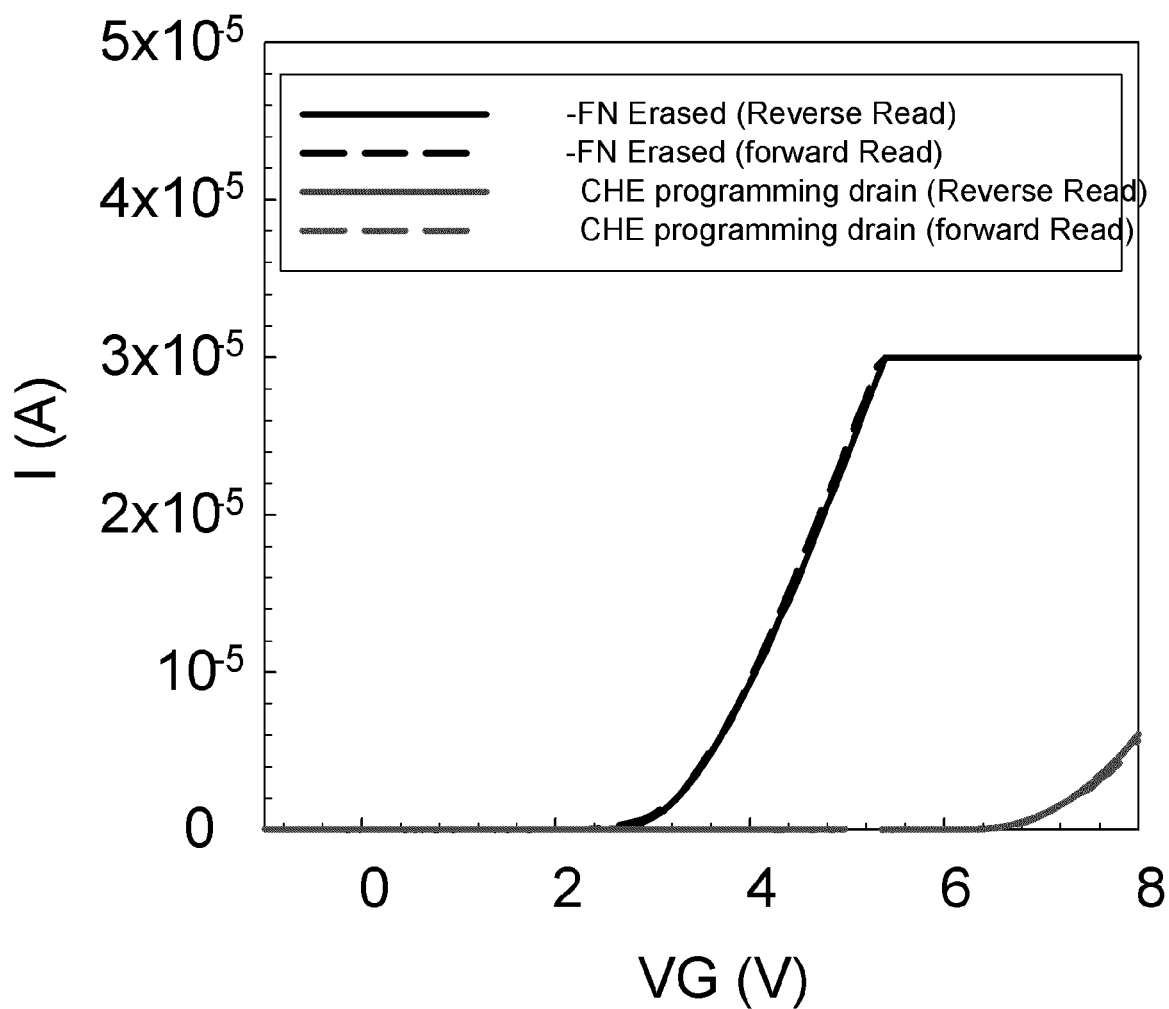
FIG. 38 is a graph on a linear scale of gate voltage versus drain current for a charge trapping floating gate memory device as described herein in both erased and programmed conditions.

FIG. 37 shows the gate voltage versus drain current on a logarithmic scale for the erased state, accomplished using −FN tunneling, and of the programmed state accomplished using channel hot electron programming from the drain side. FIG. 38 shows gate voltage versus drain current on a linear scale ranging from 0 to 5×10-5 amps. FIGS. 36 to 38 illustrate that the forward and reverse reads result in essentially identical current. This implies that the thin floating gate, which in this example is about 40 Å thick, screens the channel from any nonuniform injection that would otherwise occur with the dielectric charge trapping layer. Also, channel hot electron programming provides for programming at very high speeds to threshold voltages greater than 7 V, allowing a memory window greater than 4 V. Channel hot electron programming can be much more efficient than Fowler Nordheim programming.

Figure 39:
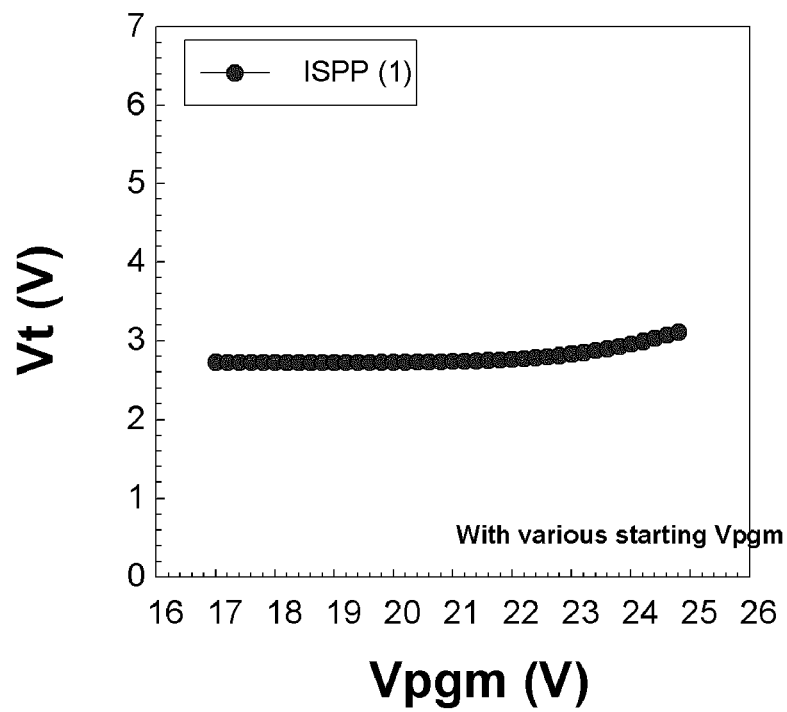
FIG. 39 is a graph of programming voltage versus threshold voltage for a tested charge trapping floating gate memory device with a tunneling barrier structure between the charge trapping layer and the floating gate that is the same as the tunneling barrier structure between the semiconductor body and the floating gate.
Figure 40:
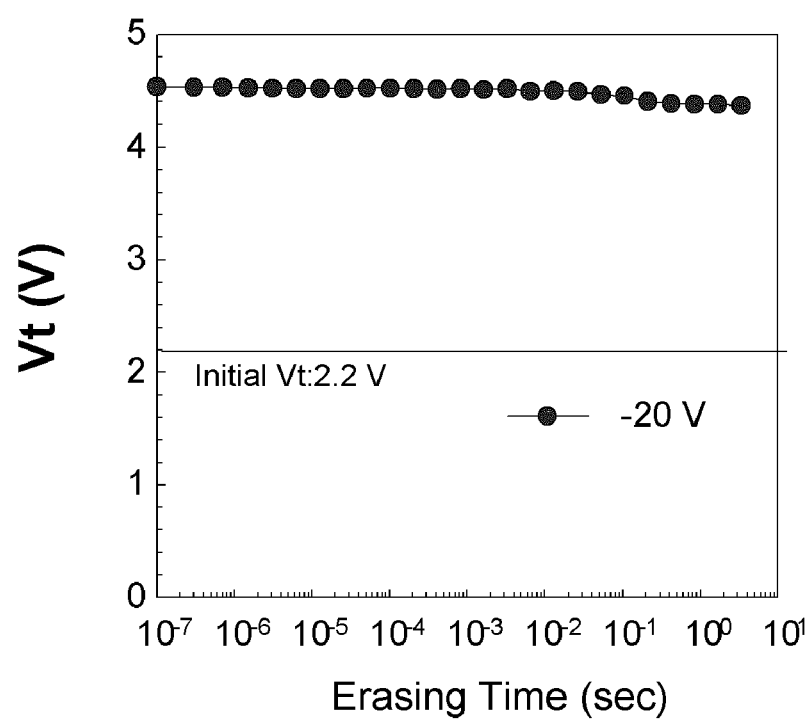
FIG. 40 is a graph of erasing voltage versus threshold voltage for a tested charge trapping floating gate memory device with a tunneling barrier structure between the charge trapping layer and the floating gate that is the same as the tunneling barrier structure between the semiconductor body and the floating gate.

FIGS. 39 and 40 illustrate the results of testing a charge trapping floating gate device in which the first and second tunneling barrier structures were identical layers of silicon dioxide about 54 Å thick. The floating gate layer, the charge trapping layer and the blocking layer were the same as that tested using a bandgap engineered structure of the second tunneling barrier structure. FIG. 39 illustrates the threshold voltage versus programming voltage plot for an ISPP programming operation on the device. As can be seen, the device could not be programmed effectively. FIG. 40 shows the threshold voltage versus erase time for an erase voltage of −20 V. Again, this figure illustrates that the cell could not be erased. It can be concluded based on this testing that the second tunneling barrier structure must have a different tunneling behavior than the first tunneling barrier structure as explained above, to encourage charge tunneling into the charge trapping layer, while acting to prevent leakage and providing for good endurance characteristics.

In summary, a flash memory device can be provided as described herein that comprises a thin floating gate memory cell in which the interpoly dielectric is replaced with a planar or near-planar dielectric stack arranged to operate as a charge trapping device, and in which the tunneling efficiency between the floating gate and the charge trapping device is greater than that between the channel and the floating gate. Most of the charge stored inside the memory cell is trapped inside the dielectric charge trapping device. Channel operation however is controlled by the equipotential floating gate structure between the trapped charge and the channel, providing DC performance similar to that of a MOSFET or traditional floating gate cell. The memory cell is adaptable for many types of array architectures, including NAND, NOR, and virtual ground AND-type architectures. The device may be implemented using both n-channel and p-channel technologies. In addition, the architecture allows structures that avoid edge effects caused by trench isolation structures adjacent charge trapping elements, provide good data retention and immunity to tunnel oxide defects, and can be made using manufacturing steps that are easily integrated into current floating gate flash memory technologies.

While the present invention is disclosed by reference to the preferred embodiments and examples detailed above, it is to be understood that these examples are intended in an illustrative rather than a limiting sense. It is to be understood and appreciated that that the fabrication steps and structures described herein do not cover a complete process flow for the manufacture of entire integrated circuits. The present invention may be practiced in conjunction with various integrated circuit fabrication techniques that are known in the art or to be developed. It is contemplated that modifications and combinations will readily occur to those skilled in the art, which modifications and combinations will be within the spirit of the invention and the scope of the following claims.

What is claimed is:

1. A memory cell comprising:
a semiconductor substrate having a surface with a source region and a drain region in the substrate and separated by a channel region;
a multilayer stack over the channel including a first tunneling barrier structure disposed on the surface of the substrate above the channel region, a floating gate disposed above the first tunneling barrier structure and above the channel region, a second tunneling barrier structure above the floating gate, a charge trapping dielectric layer above the second tunneling barrier structure and above the channel region, and a top dielectric structure disposed above the charge trapping dielectric layer; and
a top conductive layer disposed above the top dielectric structure and above the channel region;
wherein the second tunneling barrier structure has a different electron tunneling probability function than the first tunneling barrier structure for electron tunneling than the first tunneling barrier structure under bias conditions applied to program the memory cell.

2. The memory cell of claim 1, wherein the first tunneling barrier structure comprises a layer of silicon oxide between 7 and 4 nanometers thick.

3. The memory cell of claim 1, wherein the second tunneling barrier structure comprises a combination of materials, and is arranged to establish a relatively low valence band energy level near the channel surface, and an increase in valence band energy level at a first distance from the channel surface and a decrease in valence band energy at a second distance more than 2 nanometers from the channel surface.

4. The memory cell of claim 1, wherein the second tunneling barrier structure comprises a first silicon oxide layer adjacent the floating gate and having a thickness of 18 Å or less, a silicon nitride layer on the first silicon oxide layer having a thickness of 30 Å or less, and a second oxide layer on the silicon nitride layer having a thickness of 35 Å or less.

5. The memory cell of claim 1, wherein the second tunneling barrier structure comprises a barrier engineered tunneling barrier structure.

6. The memory cell of claim 1, wherein the floating gate comprises a semiconductor layer less than 10 nanometers thick.

7. The memory cell of claim 1, wherein the top dielectric structure comprises a first layer having a dielectric constant $\kappa_1$ contacting the charge trapping dielectric layer and a second layer contacting the top conductive layer, the second layer having a dielectric constant $\kappa_2$ higher than $\kappa_1$ of the first layer, and the second layer having thickness less than $\kappa_2/\kappa_1$ times that of the first layer.

8. The memory cell of claim 7, wherein the first layer comprises silicon oxide or silicon oxynitride, the second layer comprises aluminum oxide, and the charge trapping dielectric layer comprises at least one of silicon nitride and silicon oxynitride.

9. The memory cell of claim 7, wherein the dielectric constant $\kappa_2$ of the second layer is greater than 7.

10. The memory cell of claim 1, wherein the charge trapping dielectric layer comprises silicon nitride.

11. The memory cell of claim 1, including control circuitry coupled to the memory cell, the control circuitry including a program mode in which a bias condition is applied to the memory cell to induce tunneling between the channel to the floating gate, and between the floating gate and the charge trapping dielectric layer to increase negative charge trapped, and an erase mode in which a bias condition is applied to induce tunneling between the charge trapping dielectric layer and the floating gate and between the floating gate and the channel to decrease negative charge trapped.

12. A memory cell comprising:
a semiconductor body having a surface and a channel region;
a multilayer stack over the semiconductor body including a floating gate and a charge trapping dielectric layer above the floating gate, a top dielectric structure disposed above the charge trapping dielectric layer, and means for enabling electrons to move from the semiconductor body through the floating gate to the charge trapping dielectric layer under positive gate bias conditions applied for increasing a threshold voltage, while preventing electron tunneling from the charge trapping dielectric layer through the floating gate to the semiconductor body under bias conditions applied for reading; and
a top conductive layer disposed above the top dielectric structure and above the channel region.

13. The memory cell of claim 12, including control circuitry coupled to the memory cell, the control circuitry including a program mode in which a bias condition is applied to the memory cell to induce tunneling between the channel region to the floating gate, and between the floating gate and the charge trapping dielectric layer to increase negative charge trapped, and an erase mode in which a bias condition is applied to induce tunneling between the charge trapping dielectric layer and the floating gate and between the floating gate and the channel region to decrease negative charge trapped.

14. A memory cell comprising:
a semiconductor substrate having a surface with a source region and a drain region in the substrate and separated by a channel region;
a gate dielectric comprising silicon oxide between 7 and 4 nanometers thick disposed on the surface of the substrate above the channel region,
a semiconductor floating gate above the gate dielectric and above the channel region;
a tunneling barrier structure above the floating gate, the tunneling barrier structure including a first silicon oxide layer adjacent the floating gate and having a thickness of 18 Å or less, a silicon nitride layer on the first silicon oxide layer having a thickness of 30 Å or less, and a second oxide layer on the silicon nitride layer having a thickness of 35 Å or less;
a charge trapping dielectric layer between 4 and 7 nanometers thick above the tunneling barrier structure;
a blocking dielectric structure disposed above the charge trapping dielectric layer; and
a top conductive layer disposed above the blocking dielectric structure.

15. The memory cell of claim 14, wherein the blocking dielectric structure comprises a first layer having a dielectric constant $\kappa_1$ contacting the charge trapping dielectric layer and a second layer contacting the top conductive layer, the second layer having a dielectric constant $\kappa_2$ higher than $\kappa_1$ of the first layer, and the second layer having thickness less than $\kappa_2/\kappa_1$ times that of the first layer.

16. The memory cell of claim 14, wherein the floating gate comprises a semiconductor layer less than 10 nanometers thick.

17. A method for manufacturing an integrated circuit, comprising:
forming a gate dielectric layer on semiconductor substrate;
forming a patterned polysilicon layer over the gate dielectric layer, including a first pattern in a memory area region on the substrate and a second pattern in a peripheral region on the substrate;
forming a multilayer dielectric stack over the patterned polysilicon layer, the multilayer dielectric stack comprising a tunneling barrier structure in contact with the patterned polysilicon layer, a charge trapping dielectric layer above the tunneling barrier layer, and a top dielectric structure disposed above the charge trapping dielectric layer;
opening contact openings through the multilayer dielectric stack to expose the patterned polysilicon layer at selected locations in the peripheral region;
forming a patterned conductor over the multilayer dielectric stack, and contacting the patterned polysilicon layer through the contact openings at the selected locations; and
forming source and drain regions in the substrate adjacent the patterned conductor.

18. The method of claim 17, wherein the tunneling barrier structure has a greater tunneling efficiency for charge tunneling than the gate dielectric layer under bias conditions applied for program and erase operations.

19. The method of claim 17, wherein the gate dielectric layer comprises silicon oxide having a thickness between 4 and 7 nanometers.

20. The method of claim 17, wherein the forming a tunneling barrier structure comprises forming a bandgap engineered tunneling barrier structure including a plurality of dielectric layers.

21. The method of claim 17, wherein the patterned conductor layer comprises polysilicon.

22. The method of claim 17, including etching the patterned polysilicon layer in the memory area to provide floating gates.

23. The method of claim 17, wherein the top dielectric structure comprises silicon dioxide having a thickness in the range of 5 to 9 nanometers.

* * * * *